(12) United States Patent
Kon

(10) Patent No.: US 8,795,951 B2
(45) Date of Patent: Aug. 5, 2014

(54) MATERIAL FOR FORMING RESIST SENSITIZATION FILM AND PRODUCTION METHOD OF SEMICONDUCTOR DEVICE

(75) Inventor: Junichi Kon, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 12/967,615

(22) Filed: Dec. 14, 2010

(65) Prior Publication Data

US 2011/0081615 A1    Apr. 7, 2011

Related U.S. Application Data

(63) Continuation of application No. PCT/JP2009/064532, filed on Aug. 19, 2009.

(30) Foreign Application Priority Data

Aug. 20, 2008 (JP) ................... PCT/JP2008/064811

(51) Int. Cl.
*G03F 7/09* (2006.01)
*G03F 7/26* (2006.01)

(52) U.S. Cl.
USPC ....................................... 430/313; 430/271.1

(58) Field of Classification Search
USPC ................. 430/271.1, 272.1, 276.1, 311, 313
See application file for complete search history.

(56) References Cited

U.S. PATENT DOCUMENTS

| | | | |
|---|---|---|---|
| 4,640,886 A | 2/1987 | Miller et al. | |
| 5,512,417 A * | 4/1996 | Ban et al. | 430/270.14 |
| 5,733,714 A * | 3/1998 | McCulloch et al. | 430/325 |
| 5,906,912 A | 5/1999 | Watanabe et al. | |
| 5,939,236 A * | 8/1999 | Pavelchek et al. | 430/273.1 |
| 6,582,861 B2 * | 6/2003 | Buxbaum et al. | 430/5 |
| 6,610,457 B2 * | 8/2003 | Kim et al. | 430/271.1 |
| 6,803,171 B2 * | 10/2004 | Gronbeck et al. | 430/270.1 |
| 6,844,131 B2 * | 1/2005 | Oberlander et al. | 430/270.1 |
| 7,078,151 B2 * | 7/2006 | Aoki et al. | 430/271.1 |
| 2002/0033108 A1 | 3/2002 | Akiyama et al. | |
| 2005/0058929 A1 | 3/2005 | Kennedy et al. | |
| 2008/0026322 A1 | 1/2008 | Ogihara et al. | |

FOREIGN PATENT DOCUMENTS

| | | | |
|---|---|---|---|
| JP | 58-105140 | A | 6/1983 |
| JP | 62-099199 | A | 5/1987 |
| JP | 8-015868 | A | 1/1996 |
| JP | 9-281705 | A | 10/1997 |
| JP | 2002-067526 | A | 3/2002 |
| JP | 2004-119414 | A | 4/2004 |
| JP | 2005-512309 | A | 4/2005 |
| JP | 2007-147854 | A | 6/2007 |
| JP | 2008-019423 | A | 1/2008 |
| JP | 2008-158308 | A | 7/2008 |
| JP | 2008-164806 | A | 7/2008 |

OTHER PUBLICATIONS

International Search Report of PCT/JP2009/064532, mailing date Nov. 10, 2009.
Notification of Reasons for Refusal dated Jul. 10, 2012, issued in corresponding Japanese Patent Application No. 2010-525701, with Partial translation (4 pages).

\* cited by examiner

*Primary Examiner* — Anca Eoff
(74) *Attorney, Agent, or Firm* — Westerman, Hattori, Daniels & Adrian, LLP

(57) ABSTRACT

A material for forming a resist sensitization film contains a metal salt, a resin and, a solvent. A method for producing a semiconductor device contains applying such material (or a resist) onto a processing surface so as to form a resist sensitization film or a resist film, applying a resist (or the aforementioned material) onto the resist sensitization film so as to form a resist film (or a resist sensitization film); exposing the resist film (or the resist film and the resist sensitization film) to exposure light, and developing the exposed resist film (or the exposed resist film and resist sensitization film) so as to form a resist pattern; and etching the processing surface using the resist pattern as a mask so as to pattern the processing surface.

5 Claims, 12 Drawing Sheets

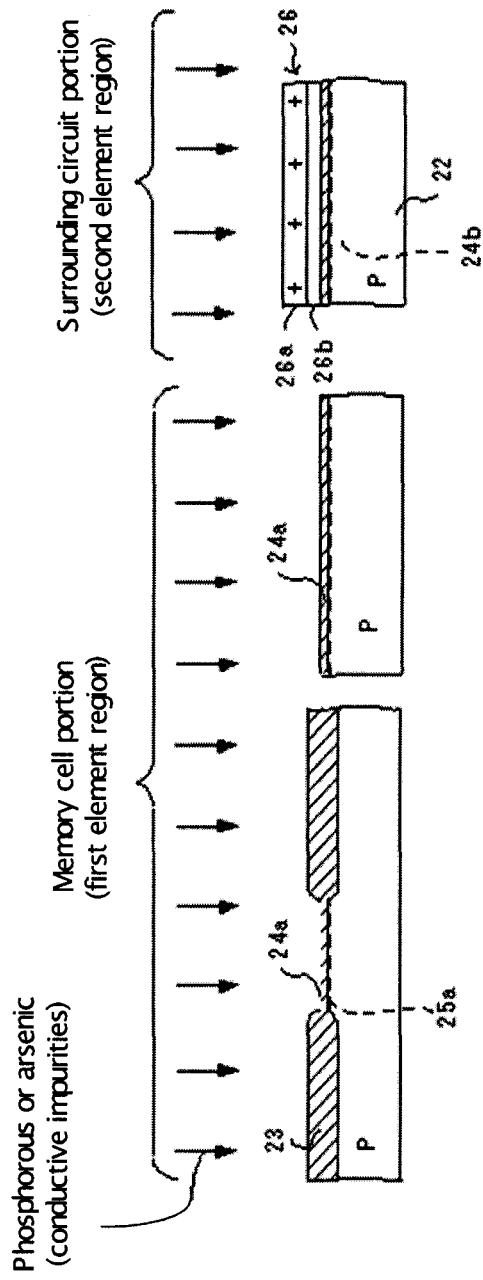
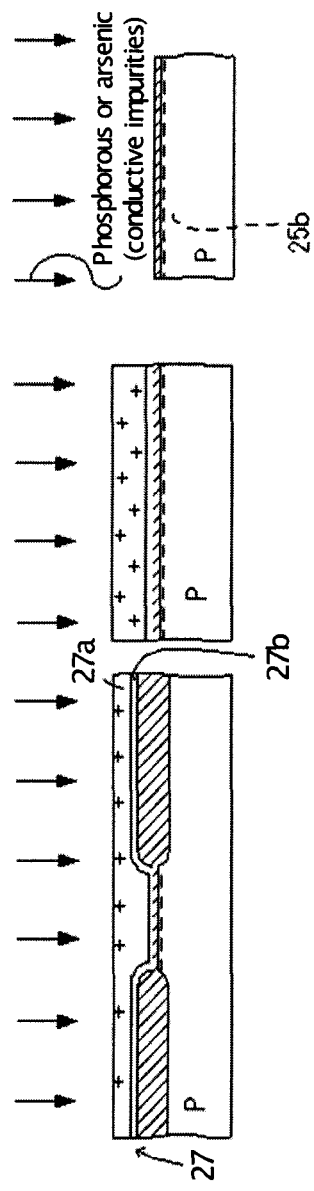
FIG. 3A
FIG. 3B

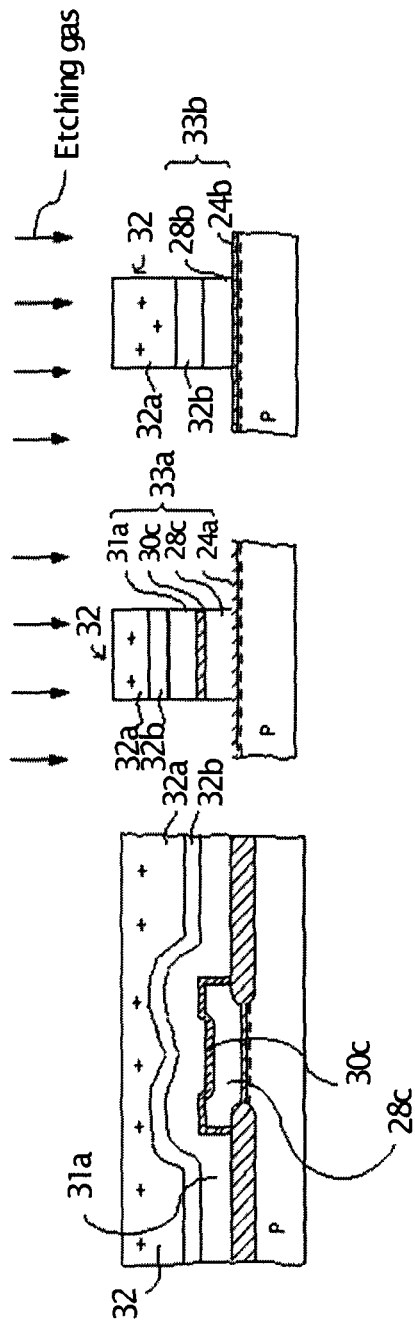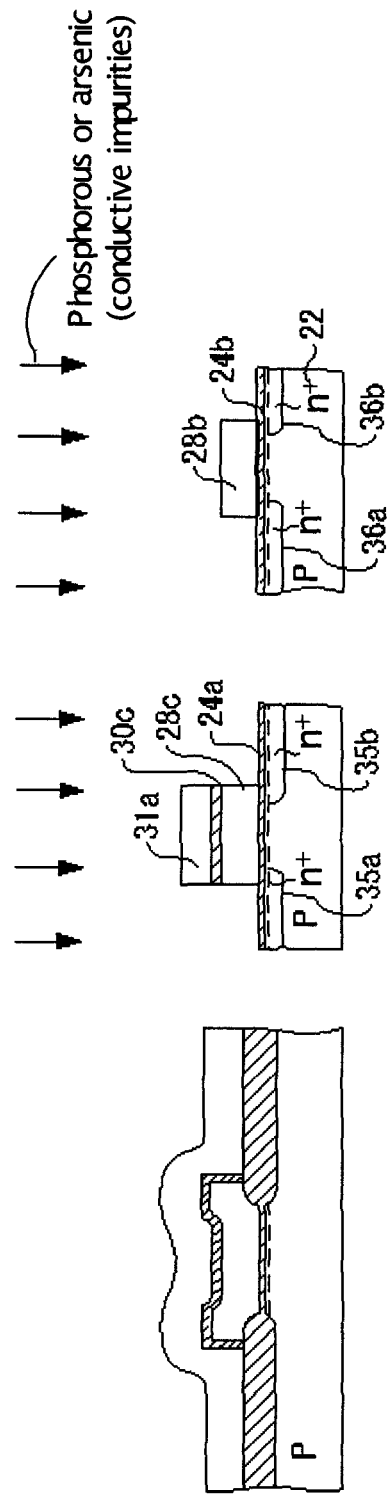

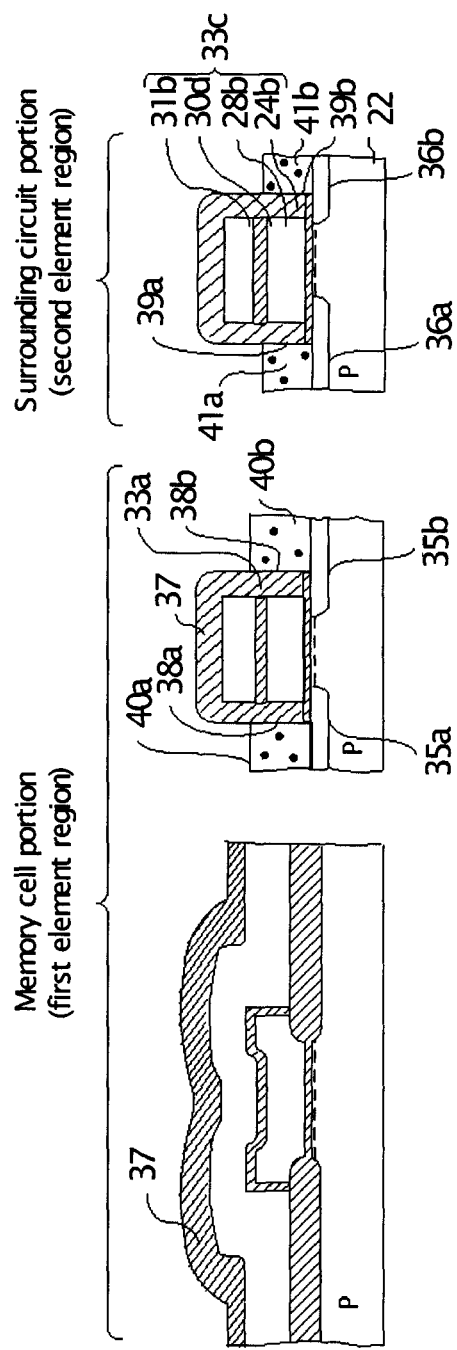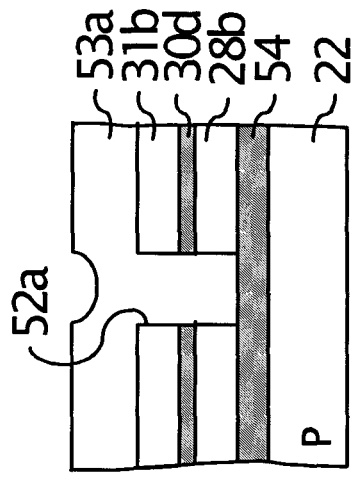

MATERIAL FOR FORMING RESIST SENSITIZATION FILM AND PRODUCTION METHOD OF SEMICONDUCTOR DEVICE

CROSS-REFERENCE TO RELATED APPLICATIONS

This application is a continuous application of International Patent Application No. PCT/JP2009/064532 filed on Aug. 19, 2009, which is based upon and claims the benefits of the priority of the prior International Patent Application No. PCT/JP2008/064811 filed on Aug. 20, 2008, the entire contents of which are incorporated herein by reference.

FIELD

The embodiments discussed herein relate to a material for forming a resist sensitization film, and a method for producing a semiconductor device using such material.

BACKGROUND

Along with the improvements in the integration degrees of semiconductor devices, such as semiconductor integrated circuits (LSI), and improvements in the recording densities of hard disks, formations of fine patterns are currently desired. It is desirable to establish a microprocessing technique corresponding to the formation of such fine pattern, and in the technical field of photolithography, pattern forming techniques using electron beam exposure have been studied.

The pattern formation technique using electron beam exposure relatively easily enables the formation of fine pattern in the size of 0.1 μm or smaller, which cannot be formed by ultraviolet ray exposure. Therefore, this technique is regarded as the pattern formation technique of the next generation, and as having a bright prospect. However, in the pattern formation technique using electron beam exposure, the exposure duration is long due to the wiring system originated in the nature of electron beams, and as a result, the throughput thereof is low.

To solve this problem, it is desirable to improve the throughput by improving the sensitivity of an electron beam resist, thereby reducing the exposure duration.

As the method for improving the sensitivity of the electron beam resist, there has been known the method in which an electron scattering layer formed of a material having a large electron scattering coefficient (e.g. a single metal such as Pt, and Mo) is formed below the film formed of the electron resist (for example, see Japanese Patent Application Laid-Open (JP-A) No. 58-105140).

In this method, the larger number of the scattered electrons is stayed in the area adjacent to the incident area of the electron beam as the electron scattering increases in the electron scattering layer, and the scattered electrons located in such area are used for photoactivity of the electron beam resist. Therefore, the sensitivity of the electron beam resist improves. In this method, however, the process for forming the electron scattering layer below the electron beam resist, and the process for selectively removing the electron scattering layer after forming a pattern on a base are both complicated.

Moreover, the relationship between high sensitivity and high resolution is a relationship of trade-off in the electron beam resist. For example, as an amount of an acid generator increases in the electron beam resist, the sensitivity of the electron beam resist film increases, but resolution of the electron beam resist film decreases.

Moreover, as a unique problem for electron beam exposure, there is an adverse influence from forward scattering (scattering in the resist film at the time of incident of an electron beam) and back scattering of electrons (scattering in the resist due to reflection from the inner portion of the base). The scattering degree of electron beams depends on the atomic weight of the element to receive an impact. Therefore, if a heavy element (e.g. a semiconductor wiring) is present below the pattern forming part, the back scattering increases, which improves the apparent sensitivity improves. Namely, in the case where there is a pattern containing the heavy element at the bottom thereof, it is difficult to form a resist pattern at a constant size.

For the reasons mentioned above, developments of materials and process techniques for improving a sensitivity of an electron resist without impairing a resolution of the electron resist have been strongly desired.

SUMMARY

According to an aspect of the invention, the disclosed material for forming a resist sensitization film contains a metal salt, a resin, and a solvent.

According to another aspect of the invention, the disclosed method for producing a semiconductor device contains: applying the disclosed material for forming a resist sensitization film onto a processing surface so as to form a resist sensitization film; applying a resist onto the resist sensitization film so as to form a resist film; exposing the resist film to exposure light, and developing the exposed resist film so as to form a resist pattern; and etching the processing surface using the resist pattern as a mask so as to pattern the processing surface.

According to another aspect of the invention, the disclosed method for producing a semiconductor device contains: applying a resist onto a processing surface so as to form a resist film; applying the disclosed material for forming a resist sensitization film onto the resist film so as to form a resist sensitization film; exposing the resist film and the resist sensitization film to exposure light, and developing the exposed resist film and sensitization film so as to form a resist pattern; and etching the processing surface using the resist pattern as a mask so as to pattern the processing surface.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 3A is a schematic explanatory diagram illustrating the first example of FLASH EPROM produced by the disclosed method for producing a semiconductor device.

FIG. 3B is a schematic explanatory diagram illustrating the first example of FLASH EPROM produced by the disclosed method for producing a semiconductor device, and illustrating the sequential step of FIG. 3A.

FIG. 3G is a schematic explanatory diagram illustrating the first example of FLASH EPROM produced by the disclosed method for producing a semiconductor device, and illustrating the sequential step of FIG. 3F.

FIG. 3H is a schematic explanatory diagram illustrating the first example of FLASH EPROM produced by the disclosed method for producing a semiconductor device, and illustrating the sequential step of FIG. 3G.

FIG. 3M is a schematic explanatory diagram illustrating a third example of FLASH EPROM produced by the disclosed method for producing a semiconductor device.

FIG. 3N is a schematic explanatory diagram illustrating a third example of FLASH EPROM produced by the disclosed method for producing a semiconductor device, and illustrating the sequential step of FIG. 3M.

Figure 1:
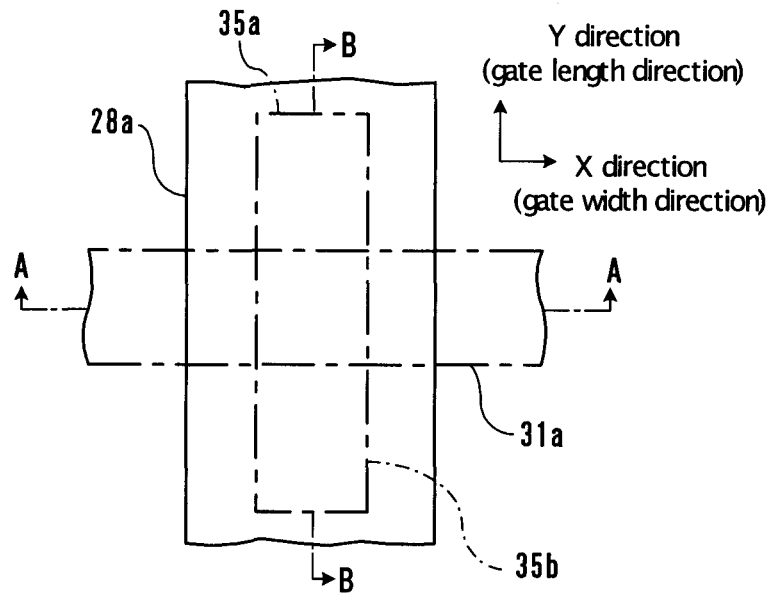
FIG. 1 is a plan view illustrating a first example of FLASH EPROM produced by the disclosed method for producing a semiconductor device.

DESCRIPTION OF EMBODIMENTS (Material for Forming Resist Sensitization Film)

The disclosed material for forming a resist sensitization film contains at least a metal salt, a resin and a solvent, and may further contain other substances, if necessary.

The resist sensitization film formed with the disclosed material may be dissolved with a developer together with a resist film, which will be explained later, during the development of the resist film so as to form an opening reaching the base of the resist sensitization film, or may be insoluble to the developer, and is etched or the like to form an opening reaching the base of the resist sensitization film. The solubility of the material for forming a resist sensitization film to the developer for the resist film can be controlled by adjusting the crosslink density of the resin using a crosslinking agent or acid generator.

—Metal Salt—

The metal salt is suitably selected depending on the intended purpose without any restriction, provided that it promotes scattering of an electron beam, but it is preferably selected from an alkali metal salt, and alkaline earth metal salt in view of easiness of the formation of metal salts, and is more preferably selected from a potassium salt, calcium salt, rubidium salt, strontium salt, cesium salt, and barium salt.

An anion of the metal salt are suitably selected depending on the intended purpose without any restriction. Examples thereof include: an inorganic ion such as a chloride ion, nitric acid ion, perchloric acid ion, sulfuric acid ion, phosphoric acid ion, hydroxide ion, and ammonium ion; and an organic ion such as an acetic acid ion, formic acid ion, and carbonic acid ion. Among them, the chloride ion, carbonic acid ion, and acetic acid ion are preferable, in view of their interactive effect with a resist, and their affinity to the solvent.

The amount of the metal salt for use is suitably selected depending on the intended purpose without any restriction, but it is preferably 1% by mass to 50% by mass, more preferably 1% by mass to 40% by mass relative to the amount of the resin. When the amount of the metal salt is less than 1% by mass, the effect for increasing sensitivity and preventing back scattering may be insufficient. When the amount thereof is more than 50% by mass, a uniform coating film may not be formed.

—Resin—

The resin is suitably selected depending on the intended purpose without any restriction. Examples thereof include acrylic resins, styrene resins, phenol resins, epoxy resins, melamine resins, urea resins, imide resin, polyethylene resins, and the like.

Moreover, various water-soluble resins can be used as the aforementioned resin.

The water-soluble resin is suitably selected depending on the intended purpose without any restriction. Examples thereof include polyvinyl alcohol, polyvinyl acetal, polyvinyl acetate, polyacrylic acid, polyvinyl pyrrolidone, polyethylene imine, polyethylene oxide, styrene-maleic acid copolymer, polyvinyl amine, polyallyl amine, oxazoline-group containing water-soluble resins, water-soluble urea resins, alkyd resins, sulfone amide resins, and the like. Among them, those having water-solubility such that 0.1 g or more thereof dissolves in 100 g of water at the temperature of 25° C.

The polyvinyl alcohol may be partially formed into acetal.

The acetal formation rate of the polyvinyl alcohol is suitably selected depending on the intended purpose without any restriction, but is preferably 0.1% to 90%, more preferably 1% to 60%, and even more preferably 5% to 40%.

When the acetal formation rate thereof is less than 0.1%, the compatibility of the resin to the nonpolar material may be significantly low. When the acetal formation rate thereof is more than 90%, the compatibility of the resin to the polar material may be significantly low. On the other hand, when the acetal formation rate thereof is within the aforementioned even more preferable range, it is advantageous for improving the compatibility to other component materials.

Moreover, the resin is preferably a resin, which is not compatible with a resist resin and a resist solvent contained in a resist, which will be explained later.

Furthermore, a conductive resin having conductivity can also be used as the resin, and has an additional function of preventing electric charge during exposure.

The conductive resin is suitably selected depending on the intended purpose without any restriction. Examples thereof include polyaniline, poly-p-phenyl vinylene, polythiophene, polypyrrole, poly-p-phenylene oxide, polyfuran, polyphenylene, polyazine, polyselenophene, polyphenylene sulfide, polyacetylene, and the like. Among them, the compounds expressed by the following general formulae are more preferable.

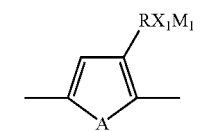

General Formula 1

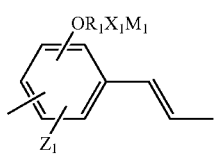

General Formula 2

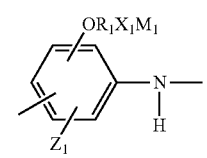

General Formula 3

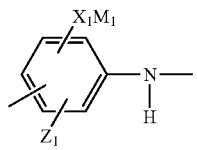

General Formula 4

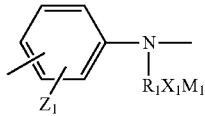

General Formula 5

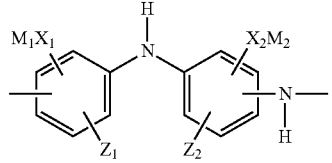

General Formula 6

In the general formulae 1 to 6, A represents NH, S, or O; R represents $R_1$ or $OR_1$; $R_1$ is C1-8 linear or branched hydrocarbon or C1-8 hydrocarbon having an ether bond; $X_1$ and $X_2$ each independently represent $SO_3$ or COO; $Z_1$ and $Z_2$ each independently represent H, $OR_1X_1H$, $OR_1H$, or an electron-donating group; $M_1$ and $M_2$ each independently represent a hydrogen ion, an ammonium ion, a C1-8 alkyl ammonium ion, and a quaternary ion of an aromatic heterocycle.

The electron-donating group is suitably selected depending on the intended purpose without any restriction. Examples thereof include a halogen group, a C1-8 alkoxy group, a C1-8 alkenyl group, and a C1-8 alkyl group.

The aromatic ammonium ion is suitably selected depending on the intended purpose without any restriction. Examples thereof include ammonium ions of aniline, 2-methoxyaniline, 3-methoxyaniline, 4-methoxyaniline, and derivatives having these structures.

The quaternary ion of the aromatic heterocycle is suitably selected depending on the intended purpose without any restriction. Examples thereof include quaternary ions of piperidine, pyrrolidine, morpholine, piperazine, pyridine, α-picoline, β-picoline, γ-picoline, quinoline, isoquinoline, pyrroline, and derivatives having these structures.

Examples of the compounds expressed by the general formulae 1 to 6 include 3-amino-4-methoxybenzene sulfonic acid polymer, furan-3-(2-ethanesulfonic acid), furan-3-(3-propanesulfonic acid), furan-3-(4-butanesulfonic acid), furan-3-(5-pentanesulfonic acid), furan-3-(6-hexanesulfonic acid), pyrrole-3-(2-ethanesulfonic acid), pyrrole-3-(3-propanesulfonic acid), pyrrole-3-(4-butanesulfonic acid), pyrrole-3-(5-pentanesulfonic acid), pyrrole-3-(6-hexanesulfonic acid), 2-methoxy-5-(propyloxy-3-sulfonic acid)-1,4-phenylenevinylene, 2-ethoxy-5-(propyloxy-3-sulfonic acid)-1,4-phenylenevinylene, 2-propyloxy-5-(propyloxy-3-sulfonic acid)-1,4-phenylenevinylene, 2-butyloxy-5-(propyloxy-3-sulfonic acid)-1,4-phenylenevinylene, 2,5-bis(propyloxy-3-sulfonic acid)-1,4-phenylenevinylene, 2,5-bis(ethyloxy-2-sulfonic acid)-1,4-phenylenevinylene, 2,5-bis(butyloxy-4-sulfonic acid)-1,4-phenylenevinylene, 5-(propyloxy-3-sulfonic acid)-1,4-phenylenevinylene, 5-(ethyloxy-2-sulfonic acid)-1,4-phenylenevinylene, 5-(butyloxy-4-sulfonic acid)-1,4-phenylenevinylene, 5-(pentyloxy-4-sulfonic acid)-1,4-phenylenevinylene, aniline-3-(2-ethanesulfonic acid), aniline-3-(3-propanesulfonic acid), aniline-3-(4-butanesulfonic acid), aniline-3-(5-pentanesulfonic acid), aniline-3-(6-hexanesulfonic acid), aniline-3-

(7-heptanesulfonic acid), aniline-3-(2-methyl-3-propanesulfonic acid), aniline-3-(2-methyl-4-butanesulfonic acid), aniline-3-sulfonic acid, aniline-N-(2-ethanesulfonic acid), aniline-N-(3-propanesulfonic acid), aniline-N-(4-butanesulfonic acid), aniline-N-(5-pentanesulfonic acid), aniline-N-(6-hexanesulfonic acid), aniline-N-(7-heptanesulfonic acid), aniline-N-(2-methyl-3-propanesulfonic acid), aniline-N-(2-methyl-4-butanesulfonic acid), 2-aminoanisole-3-sulfonic acid, 2-aminoanisole-4-sulfonic acid, 2-aminoanisole-5-sulfonic acid, 2-aminoanisole-6-sulfonic acid, 3-aminoanisole-2-sulfonic acid, 3-aminoanisole-4-sulfonic acid, 3-aminoanisole-5-sulfonic acid, 3-aminoanisole-6-sulfonic acid, 4-aminoanisole-2-sulfonic acid, 4-aminoanisole-3-sulfonic acid, 2-amino-4-ethoxybenzene sulfonic acid, 3-amino-4-ethoxybenzene sulfonic acid, 2-amino-4-butoxybenzene sulfonic acid, 3-amino-5-butoxybenzene sulfonic acid, 2-amino-4-propoxybenzene sulfonic acid, 3-amino-6-propoxybenzene sulfonic acid, 2-amino-4-isobutoxybenzene sulfonic acid, 3-amino-4-isobutoxybenzene sulfonic acid, 3-amino-4-t-butoxybenzene sulfonic acid, 2-amino-4-t-butoxybenzene sulfonic acid, 2-amino-4-heptoxybenzene sulfonic acid, 3-amino-5-heptoxybenzene sulfonic acid, 2-amino-4-hexoxybenzene sulfonic acid, 3-amino-5-octoxybenzene sulfonic acid, 2-amino-4-nanoxybenzene sulfonic acid, 3-amino-5-decanoxybenzene sulfonic acid, 2-amino-4-undecaboxybenzene sulfonic acid, and 3-amino-5-dodecanoxybenzene sulfonic acid.

—Solvent—

The solvent contains at least organic solvent or water, or both thereof, and may further contain other solvent(s), if necessary.

The organic solvent is suitably selected depending on the intended purpose without any restriction, provided that it can dissolve each substance of the material for forming a resist sensitization film, has an appropriate drying speed, and can form a uniform and smooth coating film after it evaporates from the coating liquid.

Such organic solvent is suitably selected depending on the intended purpose without any restriction. Examples thereof include glycolether esters, glycolethers, esters, ethers, ketones, cyclic esters, and alcohols.

These organic solvent may be used independently, or in combination.

The glycolether esters are suitably selected depending on the intended purpose without any restriction. Examples thereof include ethyl cellosolve acetate, methyl cellosolve acetate, propylene glycol monomethylether acetate, and propylene glycol monoethylether acetate.

The glycolethers are suitably selected depending on the intended purpose without any restriction. Examples thereof include ethyl cellosolve, methyl cellosolve, propylene glycol monomethyl ether, propylene glycol monoethyl ether, and propylene glycol monopropyl ether.

The esters are suitably selected depending on the intended purpose without any restriction. Examples thereof include ethyl lactate, butyl acetate, amyl acetate, and ethyl pyruvate.

The ethers are suitably selected depending on the intended purpose without any restriction. Examples thereof include anisole.

The ketones are suitably selected depending on the intended purpose without any restriction. Examples thereof include 2-heptanone, cyclohexanone.

The cyclic esters are suitably selected depending on the intended purpose without any restriction. Examples thereof include γ-butyrolactone.

The alcohols are suitably selected depending on the intended purpose without any restriction. Examples thereof include methanol, ethanol, propanol, isopropanol, and butanol.

—Other Substances—

The aforementioned other substances are suitably selected depending on the intended purpose without any restriction, provided that they do not adversely affect the obtainable effect of the disclosed material. Examples thereof include various additives known in the art. Such additives are suitably selected depending on the intended purpose without any restriction. For example, in the case where the improvement of the solubility or coating ability of the material (composition) is aimed, such additives include a crosslinking agent, an acid generator, a surfactant, and the like.

—Crosslinking Agent—

The crosslinking agent is suitably selected depending on the intended purpose without any restriction, provided that it has a function to crosslink the resin. Examples thereof include an amino-based crosslinking agent.

The amino-based crosslinking agent is suitably selected depending on the intended purpose without any restriction. Examples thereof include a melamine derivative, urea derivative, and uril derivative. These may be used independently, or in combination.

The melamine derivative is suitably selected depending on the intended purpose without any restriction. Examples thereof include alkoxymethyl melamine, and derivatives thereof.

The urea derivative is suitably selected depending on the intended purpose without any restriction. Examples thereof include urea, alkoxymethylene urea, N-alkoxymethylene urea, ethylene urea, ethylene urea carboxylate, and derivatives thereof.

The uril derivative is suitably selected depending on the intended purpose without any restriction. Examples thereof include benzoguanimine, glycol uril, and derivatives thereof.

The amount of the crosslinking agent for use is suitably selected depending on the intended purpose without any restriction. For example, the amount thereof is preferably 0.5% by mass to 50% by mass, more preferably 1% by mass to 40% by mass relative to the amount of the resin. When the amount of the crosslinking agent is less than 0.5% by mass, the crosslinking reaction may not be sufficiently progressed in the resin. When the amount thereof is more than 50% by mass, the crosslinking reaction may extend to a resist film which is present as an upper or lower layer of the resist sensitization film.

Note that, the crosslinking agent is added so that the resist sensitization film would not be dissolved with a resist solvent contained in a resist at the time when a resist is spin-coated or the like on the resist sensitization film to form a resist film, which will be described later.

—Acid Generator—

The acid generator is suitably selected depending on the intended purpose without any restriction. Examples thereof include thermal acid generators such as aliphatic sulfonic acid, aliphatic sulfonic acid salt, aliphatic carboxylic acid, aliphatic carboxylic acid salt, aromatic sulfonic acid, aromatic sulfonic acid salt, aromatic carboxylic acid, aromatic carboxylic acid salt, metal salt, phosphate, and nitrobenzyl tosylate.

These acid generators may be used independently, or in combination.

The thermal acid generator is suitably selected depending on the intended purpose without any restriction. Examples thereof include methylbenzene sulfonate, ethylbenzene sulfonate, propylbenzene sulfonate, methyl-p-toluene sulfonate, methyl-o-toluene sulfonate, ethyl-p-toluene sulfonate, ethyl-o-toluene sulfonate, methyl naphthalene sulfonate, ethyl-4-methoxybenzene sulfonate, 2-butoxyethyl-p-toluene sulfonate, 2-phenoxyethyl benzene sulfonate, benzyl-3-methoxycarbonylbenzene sulfonate, 2-nitroethyl benzene sulfonate, 3-acetoamino propyl-p-toluene sulfonate, diethyl sulfuric acid, di-n-propyl sulfuric acid, di-n-butyl sulfuric acid, bis(2-ethylhexyl)sulfuric acid, dilauryl sulfuric acid, distearyl sulfuric acid, bis(2-phenethyl)sulfuric acid, bis(α-naphthylmethyl)sulfuric acid, dibenzyl sulfuric acid, bis(2-butoxyethyl)sulfuric acid, bis(2-phenoxyethyl)sulfuric acid, bis(2-octylthioethyl)sulfuric acid, bis[2-(4-tolyl)thioethyl] sulfuric acid, bis(4-nitroethyl)sulfuric acid, bis(2-chloroethyl)sulfuric acid, dicyclohexyl sulfuric acid, bis(4-methylcyclohexyl)sulfuric acid, bis(4-methoxycylohexyl)sulfuric acid, bis(4-butylthiocyclohexyl)sulfuric acid, 2-nitrobenzyl tosylate, 2,4-dinitrobenzyl tosylate, 2,6-dinitrobenzyl tosylate, 4-nitrobenzyl tosylate, trifluoromethyl-6-nitrobenzyl-4-chrorobenzene sulfonate, 2-trifluoromethyl-6-nitrobenzyl-4-nitrobenzene sulfonate, and aliphatic onium salt (e.g. 2-butynyl tetramethylene sulfonium hexafluoroantimonate).

The amount of the thermal acid generator for use is suitably selected depending on the intended purpose without any restriction. For example, the amount thereof is preferably 0.5% by mass to 40% by mass relative to the amount of the resin.

Moreover, a photo-acid generator can also be used, other than the thermal acid generator.

The photo-acid generator is suitably selected depending on the intended purpose without any restriction. Examples thereof include an onium salt, a sulfonium salt, a halogen-containing triazine compound, a sulfone compound, an aromatic sulfonate compound, and a sulfonate compound of N-hydroxyimide.

The onium salt is suitably selected depending on the intended purpose without any restriction. Examples thereof include diaryl iodonium salt, triaryl selenonium salt, and triaryl sulfonium salt.

The diaryl iodonium salt is suitably selected depending on the intended purpose without any restriction. Examples thereof include diphenyl iodonium trifluoromethane sulfonate, 4-methoxyphenylphenyliodonium hexafluoroantimonate, 4-methoxyphenylphenyliodonium trifluoromethane sulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, and bis(4-tert-butylphenyl)iodonium trifluoromethane sulfonate.

The triaryl selenonium salt is suitably selected depending on the intended purpose without any restriction. Examples thereof include triphenylselenonium hexafluorosulfonate, triphenylselenonium fluoroborate, and triphenylselenonium hexafluoroantimonate.

The triaryl sulfonium salt is suitably selected depending on the intended purpose without any restriction. Examples thereof include triphenylsulfonium hexafluorophosphate, triphenylsulfonium hexafluoroantimonate, diphenyl-4-thiophenoxyphenylsulfonium hexafluoroantimonate, and diphenyl-4-thiophenoxyphenylsulfonium pentafluorohydroxyantimonate.

The sulfonium salt is suitably selected depending on the intended purpose without any restriction. Examples thereof include triphenylsulfonium hexafluorophosphate, triphenylsulfonium hexafluoroantimonate, triphenylsulfonium trifluoromethane sulfonate, 4-methoxyphenyldiphenylsulfonium hexafluoroantimonate, 4-methoxyphenyldiphenylsulfonium trifluoromethane sulfonate, p-tolyldiphenylsulfonium trifluoromethane sulfonate, 2,4,6-trimethylphenyldiphenylsulfonium trifluoromethane sulfonate, 4-tert-butylphenyldiphenylsulfonium trifluoromethane sulfonate, 4-phenylthiophenyldiphenylsulfonium hexafluorophosphate, 4-phenylthiophenyldiphenylsulfonium hexafluoroantimonate, 1-(2-naphthoylmethyl)thiolanium hexafluoroantimonate, 1-(2-naphthoylmethyl)thiolanium trifluoromethane sulfonate, 4-hydroxy-1-naphthyldimethylsulfonium hexafluoroantimonate, and 4-hydroxy-1-naphthyldimethylsulfonium trifluoromethane sulfonate.

The halogen-containing triazine compound is suitably selected depending on the intended purpose without any restriction. Examples thereof include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxolan-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-dimethoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine, and 2-(4-pentyloxystyryl)-4,6-bis(trichloromethyl)-1,3,5-triazine.

The sulfone compound is suitably selected depending on the intended purpose without any restriction. Examples thereof include diphenyldisulfone, di-p-tolyldisulfone, bis(phenylsulfonyl)diazomethane, bis(4-chlorophenylsulfonyl)diazomethane, bis(p-tolylsulfonyl)diazomethane, bis(4-tert-butylphenylsulfonyl)diazomethane, bis(2,4-xylylsulfonyl)diazomethane, bis(cyclohexylsulfonyl)diazomethane, (benzoyl)(phenylsulfonyl)diazomethane, and phenylsulfonylacetophenone.

The aromatic sulfonate compound is suitably selected depending on the intended purpose without any restriction. Examples thereof include α-benzoylbenzyl-p-toluene sulfonate (common name: benzoin tosilate), β-benzoyl-β-hydroxyphenethyl-p-toluene sulfonate (common name: α-methylolbenzoin tosilate), 1,2,3-benzene-tolyl trismethane sulfonate, 2,6-dinitrobenzyl-p-toluene sulfonate, 2-nitrobenzyl-p-toluene sulfonate, and 4-nitrobenzyl-p-toluene sulfonate.

The sulfonate compound of N-hydroxyimide is suitably selected depending on the intended purpose without any restriction. Examples thereof include N-(phenylsulfonyloxy) succinimide, N-(trifluoromethylsulfonyloxy) succinimide, N-(p-chlorophenylsulfonyloxy)succinimide, N-(cyclohexylsulfonyloxy)succinimide, N-(1-naphthylsulfonyloxy)succinimide, N-(benzylsulfonyloxy)succinimide, N-(10-camphorsulfonyloxy)succinimide, N-(trifluoromethylsulfonyloxy)phthalimide, N-(trifluoromethylsulfonyloxy)-5-norbornene-2,3-dicarboxylmide, N-(trifluoromethylsulfonyloxy)naphthalimide, and N-(10-camphorsulfonyloxy)naphthalimide.

Among them, the triaryl sulfonium salt, diaryl iodonium salt, and triaryl selenium salt are preferable because they have high quantum yield, and can be removed from the film as gas after being decomposed.

—Surfactant—

The surfactant is suitably selected depending on the intended purpose without any restriction. Examples thereof include a nonionic surfactant, a cationic surfactant, an anionic surfactant, and an amphoteric surfactant. These may be used independently, or in combination. Among them, the nonionic surfactant is preferable as it does not contain a metal ion.

The nonionic surfactant is suitably selected depending on the intended purpose without any restriction. Examples of the nonionic surfactant include alkoxylate surfactants, fatty acid ester surfactants, amide surfactants, alcohol surfactants, and ethylene diamine surfactants. Specific examples of the nonionic surfactant include polyoxyethylene-polyoxypropylene condensation products, polyoxyalkylene alkylethers, polyoxyethylene alkylethers, polyoxyethylene derivatives, sorbitan fatty acid esters, glycerin fatty acid esters, primary alcohol ethoxylates, phenol ethoxylates, nonylphenol ethoxylates, octylphenol ethoxylates, laurylalcohol ethoxylates, oleylalcohol ethoxylates, fatty acid esters, amides, natural alcohols, ethylene diamines, and secondary alcohol ethoxylates.

The cationic surfactant is suitably selected depending on the intended purpose without any restriction. Examples thereof include an alkyl cationic surfactant, an amide-based quaternary cationic surfactant, and an ester-based quaternary cationic surfactant.

The anionic surfactant is suitably selected depending on the intended purpose without any restriction. Examples thereof include fatty acid, higher alcohol sulfate, sulfuric acid ester salt of fluid fatty oil, sulfuric acid salts of aliphatic amine and aliphatic amide, phosphoric acid ester of aliphatic alcohol, sulfonic acid salt of dibasic fatty acid ester, sulfonic acid salt of aliphatic amide, alkylallyl sulfonate, and salt of naphthalene sulfonic acid-formaline condensate.

The amphoteric surfactant is suitably selected depending on the intended purpose without any restriction. Examples thereof include an amine oxide-based surfactant, and a betaine-based surfactant.

The amount of the surfactant contained in the material for forming a resist sensitization film is suitably adjusted depending on the substances for use or amounts thereof.

(Method for Producing Semiconductor Device)

The disclosed method for producing a semiconductor device contains at least a resist sensitization film forming step, a resist film forming step, a resist pattern forming step, and a patterning step, and may further contain other steps, if necessary.

—Resist Sensitization Film Forming Step—

The resist sensitization film forming step is applying a material for forming a resist sensitization film onto the processing surface (base) or a resist film. Note that, the phrase "onto the base" means "to the area in contact with a surface of the base", or "to the upper portion of the base". In addition, the phrase "onto the resist film" means "to the area in contact with a surface of the resist film", or "to the upper portion of the resist film".

The method for the application is suitably selected depending on the intended purpose without any restriction. For example, the application of the material is suitably performed by spin coating. In the case of the spin coating, for example, a revolution of the spin coater is preferably 100 rpm to 10,000 rpm, more preferably 800 rpm to 5,000 rpm, and the duration for spin coating is, for example, preferably about 1 second to about 10 minutes, more preferably 1 second to 90 seconds.

The thickness of the coated resist sensitization film is suitably selected depending on the intended purpose without any restriction.

The processing surface (base) is suitably selected depending on the intended purpose without any restriction. Examples thereof include a surface of a semiconductor substrate in an electric device such as a semiconductor device, and a surface of an alloy substrate in a magnetic head and the like. Specific examples thereof preferably include a substrate such as a silicon wafer, and an AlTiC wafer, and various oxide films.

—Resist Film Forming Step—

The resist film forming step is applying a resist onto the processing surface (base) or the resist sensitization film so as to form a resist film.

The resist preferably contains at least a resin (e.g. t-butoxycarbonyl (t-Boc) protected poly(p-hydroxy styrene)), a photo-acid generator (e.g., diphenyliodonium nonafluorobutane sulfonate), an additive (e.g., hexyl amine), and a solvent (e.g., propylene glycol monomethylether acetate).

—Resist Pattern Forming Step—

The resist pattern forming step is exposing the resist film, or the resist film and the resist sensitization film to exposure light, and developing the resist film, or the resist film and the resist sensitization film so as to form a resist pattern.

—Exposure—

The exposure can be suitably performed by means of a conventional exposure device, and is carried out by selectively applying exposure light to the resist film (or the resist film and the resist sensitization film). In the case where a photo-acid generator is contained in the resist, the photo-acid generator contained in the exposed area of the resist is decomposed by the exposure light to thereby generate acid. The generated acid initiates the curing reaction of the resist to thereby form a pattern latent image. Depending on the materials constituting the resist, the exposure may be performed after the heating step, which will be explained later.

As the exposure is carried out by selectively applying the exposure light to a partial area of the resist film, the resist film of this area changes its solubility or polarity. Therefore, during the developing, which will be explained later, an unreacted area other than the area in which the solubility or polarity has been changed is remained (in the case of a positive resist) or removed (in the case of a negative resist) to form a resist pattern.

The exposure light is suitably selected depending on the intended purpose without any restriction, but it is preferably selected from ultraviolet rays, excimer laser beams, and ionizing radiation (at least one charged particle beam selected from an electron beam, convergent ion beam, positron beam, $\alpha$-ray, $\beta$-ray, $\mu$-particle ray, $\pi$-particle ray, X ray, proton beam, heavy proton beam, and heavy ion beam), is more preferably selected from activation energy beams such as X ray, an electron beam, and a convergent ion beam, and is particularly preferably an electron beam. Use of the electron beam as the exposure light significantly improves the sensitivity of the resist.

—Developing—

In the course of the developing, uncured portions of the resist film are removed after curing the exposed (unexposed) portion of the resist film.

The method for removing the uncured portions is suitably selected depending on the intended purpose without any restriction. Examples thereof include a method for removing the uncured portions using a developer.

The developer is suitably selected depending on the intended purpose without any restriction, but the developer is preferably water or an alkali aqueous solution, as use of such developer reduces loads to the environment.

The alkaline compound used for the alkali aqueous solution is suitably selected depending on the intended purpose without any restriction. Examples thereof include: inorganic alkalis such as sodium hydroxide, potassium hydroxide, sodium silicate, ammonia; primary amine such as ethyl amine, and propyl amine; secondary amine such as diethyl amine, and dipropyl amine; tertiary amine such as trimethyl amine, and triethyl amine; alcohol amine such as diethylethanol amine, and triethanol amine; and quaternary ammonium hydroxide such as tetramethyl ammonium hydroxide, tetraethylammonium hydroxide, triethylhydroxymethylammonium hydroxide, and trimethylhydroxyethyl ammonium.

Moreover, to the alkali aqueous solution, for example, a water-soluble organic solvent such as methyl alcohol, ethyl alcohol, propyl alcohol, and ethylene glycol, a surfactant, a dissolution inhibitor for the resin, and the like may be added, if necessary. As the surfactant, those described in the section for the material for forming a resist sensitization film can be used.

The resist pattern forming step can easily and efficiently form a precise pattern with high sensitivity and high dissolution at low cost, without causing unintended deletion of the pattern or size variations. Therefore, it is suitable for the formation of various resist patterns, such as a line and space pattern, a hole pattern (for a contact hole, etc.), a pillar (column) pattern, a trench (groove) pattern, and a line pattern. The resist pattern formed by the resist pattern forming step can be used, for example, as a mask pattern, or a reticle pattern, and is suitably used for producing various wirings, magnetic heads, functional parts such as a liquid crystal display (LCD), a plasma display panel (PDP) and a surface elastic wave (SAW) filter, optical parts used for connection of optical wirings, minute parts such as micro-actuator, and semiconductor devices. The resist pattern formed by the resist pattern forming step is also suitably used for the disclosed method for forming a semiconductor device.

—Patterning Step—

The patterning step is etching the processing surface using the resist pattern as a mask (a mask pattern or the like) so as to pattern the processing surface.

The method of the etching is suitably selected depending on the intended purpose without any restriction. Preferable examples thereof include selective vapor deposition, and dry etching. The conditions for the etching are suitably selected depending on the intended purpose without any restriction.

By performing the patterning in the patterning step with the selective vapor deposition or etching using, as a mask, the resist pattern formed in the resist pattern forming step, a device having a finely processed pattern having a uniform and narrow line width, formed of a material such as a metal, can be produced. For example, a semiconductor device having a wiring whose line pitch is about 50 nm can be produced.

—Other Steps—

The aforementioned other steps are suitably selected depending on the intended purpose without any restriction. Examples thereof include a heating step, and a removing step.

—Heating Step—

The heating step is heating the material for forming a resist sensitization film.

It is preferred in the heating step that the coated material for forming a resist sensitization film be baked (heating and drying) during or after the application (coating) of the material for forming a resist sensitization film.

The conditions (e.g. heating temperature, heating duration), method, and the like for the heating step are suitably selected depending on the intended purpose without any restriction, provided that the material for forming a resist sensitization film is not decomposed. The heating temperature is suitably selected depending on the intended purpose without any restriction, but the heating temperature is preferably about 50° C. to about 300° C., more preferably 70° C. to 270° C., and even more preferably 100° C. to 250° C.

When the heating temperature is lower than 50° C., the solvent may not be dried efficiently. When the heating temperature is higher than 300° C., the resin may be thermally decomposed.

The duration for heating in the heating step is suitably selected depending on the intended purpose without any restriction, but it is preferably about 10 seconds to about 5 minutes, more preferably 30 seconds to 90 seconds.

—Removing Step—

The removing step is removing the resist sensitization film.

The method for removing the resist sensitization film is suitably selected depending on the intended purpose without any restriction. Examples thereof include water washing, developing, and etching.

Among them, water washing is preferable in view of its easiness. The developer used for the developing is suitably selected depending on the intended purpose without any restriction. Examples thereof include a mixed solution of anisole and xylene (weight ratio: 70/30).

Here, it is preferred that the resist sensitization film provided below the resist film be insoluble with the developer for the resist film, because the removing portion of the resist sensitization film can be easily controlled. If the resist sensitization film is dissolved to the developer for the resist film, the developer permeates in the resist sensitization film through the resist film during the developing for the resist film. As a result, unintended portions may be developed.

By forming the resist sensitization film containing the metal salt and the resin on the base, which is a support of the resist film, the apparent sensitivity of the resist film can be improved, and electrons are prevented from getting into the base as well as preventing electrons from bouncing back from the base to the resist film, to thereby significantly reduce the adverse influence from back scattering.

Moreover, by forming the resist sensitization film containing the metal salt and the resin at upper side of the resist film formed on the base, scattering of electrons is promoted in the resist sensitization film at the time of the exposure of the electron beam, the quantity of electrons contributing to a reaction of the resist increases, which improves the apparent sensitivity of the resist.

EXAMPLES

Examples of the invention will be explained hereinafter, but these examples shall not be construed as to limit the scope of the invention.

Examples 1 to 21, and Comparative Examples 1 to 5

—Preparation of Material for Forming Resist Sensitization Film—

Materials for forming a resist sensitization film each having the composition presented in Tables 1-1 and 1-2 were prepared.

In Tables 1-1 and 1-2, the unit for the numbers within the blackest is "parts by mass."

Moreover, in the columns "metal salt" of Tables 1-1 and 1-2, "A-1" denotes cesium carbonate (manufactured by Kanto Chemical Co., Inc.), "A-2" denotes barium acetate (manufactured by Kanto Chemical Co., Inc.), "A-3" denotes rubidium carbonate (manufactured by Kanto Chemical Co., Inc.), "A-4" denotes strontium chloride (manufactured by Kanto Chemical Co., Inc.), "A-5" denotes potassium carbonate (manufactured by Kanto Chemical Co., Inc.), and "A-6" denotes calcium acetate (manufactured by Kanto Chemical Co., Inc.).

In the columns "resin" of Tables 1-1 and 1-2, "B-1" denotes polymethylmethacrylate (manufactured by Sigma-Aldrich Japan Inc.), "B-2" denotes poly-p-hydroxystyrene (manufactured by Nippon Soda Co., Ltd.), "B-3" denotes 3-amino-4-methoxybenzene sulfonic acid polymer (synthesized by the method described in the paragraph [0064] of JP-A No. 08-109351), and "B-4" denotes 30% acetalized polyvinyl alcohol.

In the columns "crosslinking agent" of Tables 1-1 and 1-2, "C-1" denotes hexamethoxymethyl melamine (manufactured by Tokyo Chemical Industry Co., Ltd.), "C-2" denotes N,N'-dumethoxymethyldimethoxyethylene urea (manufactured by Sanwa Chemical Co., Ltd.), and "C-3" denotes tetramethoxymethylglycol uril (manufactured by Tokyo Chemical Industry Co., Ltd.).

In the columns "thermal acid generator" of Tables 1-1 and 1-2, "D-1" denotes 2-nitrobenzyl tosylate (manufactured by Midori Kagaku Co., Ltd.).

In the columns "solvent" of Tables 1-1 and 1-2, "E-1" denotes anisole (manufactured by Kanto Chemical Co., Inc.), "E-2" denotes ethyl lactate (manufactured by Kanto Chemical Co., Inc.), "E-3" denotes water, and "E-4" denotes isopropyl alcohol (manufactured by Kanto Chemical Co., Inc.).

TABLE 1-1

| | Components (pats by mass) | | | | | |
|---|---|---|---|---|---|---|
| | Metal salt | Resin | Crosslinking agent | Thermal acid generator | Solvent | Baking temperature |
| Comp. Ex. 1 | — | B-1(100) | — | — | E-1(700) E-2(400) | 180° C. |
| Ex. 1 | A-1(10) | B-1(100) | — | — | E-1(700) E-2(400) | 180° C. |
| Ex. 2 | A-1(10) | B-1(100) | — | — | E-1(700) E-2(400) | 180° C. |
| Ex. 3 | A-1(10) | B-1(100) | — | — | E-1(700) E-2(400) | 180° C. |
| Ex. 4 | A-1(1) | B-1(100) | — | — | E-1(700) E-2(400) | 180° C. |
| Ex. 5 | A-1(30) | B-1(100) | — | — | E-1(700) E-2(400) | 180° C. |
| Ex. 6 | A-1(50) | B-1(100) | — | — | E-1(700) E-2(400) | 180° C. |
| Comp. Ex. 2 | — | B-2(100) | C-1(10) | D-1(5) | E-2(1,000) | 170° C. |
| Ex. 7 | A-1(10) | B-2(100) | C-1(10) | D-1(5) | E-2(1,000) | 170° C. |
| Ex. 8 | A-1(10) | B-2(100) | C-2(10) | D-1(5) | E-2(1,000) | 170° C. |
| Ex. 9 | A-1(10) | B-2(100) | C-3(10) | D-1(5) | E-2(1,000) | 170° C. |

TABLE 1-2

| | Components (parts by mass) | | | | | |
|---|---|---|---|---|---|---|
| | Metal salt | Resin | Crosslinking agent | Thermal acid generator | Solvent | Baking temperature |
| Ex. 10 | A-1(10) | B-2(100) | C-1(10) | D-1(5) | E-2(1,000) | 50° C. |
| Ex. 11 | A-1(10) | B-2(100) | C-1(10) | D-1(5) | E-2(1,000) | 70° C. |
| Ex. 12 | A-1(10) | B-2(100) | C-1(10) | D-1(5) | E-2(1,000) | 270° C. |
| Ex. 13 | A-1(10) | B-2(100) | C-1(10) | D-1(5) | E-2(1,000) | 300° C. |
| Ex. 14 | A-2(10) | B-2(100) | C-1(10) | D-1(5) | E-2(1,000) | 170° C. |
| Ex. 15 | A-3(10) | B-2(100) | C-1(10) | D-1(5) | E-2(1,000) | 170° C. |
| Ex. 16 | A-4(10) | B-2(100) | C-1(10) | D-1(5) | E-2(1,000) | 170° C. |
| Ex. 17 | A-5(10) | B-2(100) | C-1(10) | D-1(5) | E-2(1,000) | 170° C. |
| Ex. 18 | A-6(10) | B-2(100) | C-1(10) | D-1(5) | E-2(1,000) | 170° C. |
| Comp. Ex. 3 | — | B-3(100) | C-1(10) | D-1(5) | E-3(810) E-4(90) | 150° C. |
| Ex. 19 | A-2(10) | B-3(100) | C-1(10) | D-1(5) | E-3(810) E-4(90) | 150° C. |
| Comp. Ex. 4 | — | B-3(100) | — | — | E-3(810) E-4(90) | 100° C. |
| Ex. 20 | A-1(10) | B-3(100) | — | — | E-3(810) E-4(90) | 100° C. |
| Comp. Ex. 5 | — | B-4(100) | — | — | E-3(810) E-4(90) | 100° C. |
| Ex. 21 | A-3(10) | B-4(100) | — | — | E-3(810) E-4(90) | 100° C. |

The formation of the resist sensitization film, the preparation of the resist, and the formation of the resist pattern are separately explained for Examples 1 to 19 and Comparative Examples 1 to 3, and for Examples 20 to 21 and Comparative Examples 4 to 5.

Examples 1 to 19 and Comparative Examples 1 to 3

—Formation of Resist Sensitization Film—

The material for forming a resist sensitization film, which had been prepared according to the mixing ratio presented in Tables 1-1 and 1-2 was applied onto a silicon substrate in which a tungsten wiring having a thickness of about 300 nm was partially embedded at the location which was about 200 nm in depth from the surface of the substrate so as to have a wiring occupancy ratio of about 25%, by spin coating. Thereafter, the coated material was baked at the baking temperature indicated in Tables 1-1 and 1-2, to thereby form a coating film (a resist sensitization film). Note that, in all examples and comparative examples, the thickness of the coating film (the resist sensitization film) was made 100 nm (1,000 Å) by adjusting the revolution number of the spin coating, unless otherwise stated.

Note that, in Example 6, a uniform film could not be formed due to clouding. Moreover, in Example 13, a uniform film could not be formed due to thermal decomposition of the components.

—Preparation of Resist—

| A resist having the following formulation was prepared. | | |
|---|---|---|
| Resin | 30% t-butoxycarbonyl (t-Boc) protected poly(p-hydroxystyrene) (manufactured by Maruzen Petrochemical Co., Ltd.) | 100 parts by mass |
| Photo acid generator | diphenyliodonium nonafluorobutanesulfonate (manufactured by Midori Kagaku Co., Ltd.) | 5 parts by mass |
| Additive | hexylamine (manufactured by Kanto Chemical Co., Ltd.) | 0.5 parts by mass |
| Solvent | propyleneglycol monomethylether acetate (manufactured by Kanto Chemical Co., Ltd.) | 700 parts by mass |

—Formation of Resist Pattern—

After applying the resist (chemically amplified resist) composition onto the coating film (the resist sensitization film) by spin coating, the coated resist was baked at 110° C. for 120 seconds.

Next, a plurality of line patterns each having a width of 50 nm was drawn on the substrate on which the resist film has been formed above the coating film (the resist sensitization film), by changing the exposure dose stepwise, for example, by means of an electron beam exposure device (ELS-5700, manufactured by ELIONIX INC.) of acceleration voltage of 50 keV. Thereafter, the exposed resist film was baked, for example, at 110° C. for 90 seconds, followed by developing with 2.38% tetramethylammonium hydroxide aqueous solution for 60 seconds.

The line width of the line pattern formed in the aforementioned manner was measured by a scanning electron microscope (S-4500, manufactured by Hitachi, Ltd.), and the exposure dose at which a pattern having a line width of 50 nm could be formed was determined as sensitivity.

The sensitivities of Examples 1 to 19 and Comparative Examples 1 to 3 are presented in Table 2.

Note that, the thicknesses of the coating films (the resist sensitization films) of Examples 1 to 3 can be appropriately changed by adjusting the revolution number of spin coating.

Examples 20 to 21 and Comparative Examples 4 to 5

—Preparation of Resist—

| A resist having the following formulation was prepared. | | |
|---|---|---|
| Resin | 30% t-butoxycarbonyl (t-Boc) protected poly(p-hydroxystyrene) (manufactured by Maruzen Petrochemical Co., Ltd.) | 100 parts by mass |
| Photo acid generator | diphenyliodonium nonafluorobutanesulfonate (manufactured by Midori Kagaku Co., Ltd.) | 5 parts by mass |
| Additive | hexylamine (manufactured by Kanto Chemical Co., Ltd.) | 0.5 parts by mass |
| Solvent | propyleneglycol monomethylether acetate (manufactured by Kanto Chemical Co., Ltd.) | 700 parts by mass |

—Formation of Resist Sensitization Film—

The prepared resist was applied onto a silicon substrate in which tungsten wiring having a thickness of about 300 nm was partially embedded at the location which was about 200 nm in depth from the surface of the substrate so as to have a wiring occupancy ratio of about 25%, by spin coating. Thereafter, the coated material was baked, for example, at 110° C. for 120 seconds to form a resist film. The material for forming a resist sensitization film, which had been prepared according to the mixing ratio presented in Tables 1-1 and 1-2 was applied onto the resist film by spin coating, and baked at the baking temperature indicated in Tables 1-1 and 1-2, to thereby form a coating film (a resist sensitization film).

Note that, in all examples and comparative examples, the thickness of the coating film (the resist sensitization film) was made 100 nm (1,000 Å) by adjusting the revolution number of the spin coating, unless otherwise stated.

—Formation of Resist Pattern—

Next, a plurality of line patterns each having a width of about 50 nm was drawn on the substrate on which the coating film (the resist sensitization film) had been formed above the resist film, by changing the exposure dose stepwise by means of an electron beam exposure device (ELS-5700, manufactured by ELIONIX INC.) of acceleration voltage of 50 keV. Thereafter, the exposed resist film was baked at 110° C. for 90 seconds, followed by developing with 2.38% tetramethylammonium hydroxide aqueous solution for 60 seconds.

The line width of the line pattern formed in the aforementioned manner was measured by a scanning electron microscope (S-4500, manufactured by Hitachi, Ltd.), and the exposure dose at which a pattern having a line width of 50 nm could be formed was determined as sensitivity.

The sensitivities of Examples 20 to 21 and Comparative Examples 4 to 5 are presented in Table 2.

In the course of developing, the resist sensitization film dissolved to 2.38% tetramethylammonium hydroxide aqueous solution, to thereby be removed.

TABLE 2

| | Exposure dose ($\mu Ccm^{-2}$) | | Sensitivity ratio (No W-embedded substrate/ W-embedded substrate) |
|---|---|---|---|
| | W-embedded substrate | No W-embedded substrate | |
| Comp. Ex. 1 | 18 | 25 | 1.39 |
| Ex. 1 | 10.5 | 12 | 1.14 |
| Ex. 2 (thickness: 70 nm) | 12.5 | 16 | 1.28 |
| Ex. 3 (thickness: 200 nm) | 8.5 | 10 | 1.18 |
| Ex. 4 | 17 | 23 | 1.35 |
| Ex. 5 | 9 | 10.5 | 1.17 |
| Ex. 6 | 9 | 10.5 | 1.17 |
| Comp. Ex. 2 | 18 | 25 | 1.39 |
| Ex. 7 | 12 | 15 | 1.25 |
| Ex. 8 | 12.5 | 16 | 1.28 |
| Ex. 9 | 12 | 16 | 1.33 |
| Ex. 10 | 17 | 23 | 1.35 |
| Ex. 11 | 15 | 19 | 1.27 |
| Ex. 12 | 13.5 | 17 | 1.26 |
| Ex. 13 | 15.5 | 21 | 1.35 |
| Ex. 14 | 12.5 | 15.5 | 1.24 |
| Ex. 15 | 15 | 19 | 1.27 |
| Ex. 16 | 15 | 20 | 1.33 |
| Ex. 17 | 17.5 | 23 | 1.31 |
| Ex. 18 | 18 | 22.5 | 1.25 |
| Comp. Ex. 3 | 19 | 26 | 1.37 |
| Ex. 19 | 11.5 | 13.5 | 1.17 |
| Comp. Ex. 4 | 18 | 24 | 1.33 |
| Ex. 20 | 15.5 | 20.5 | 1.32 |
| Comp. Ex. 5 | 18 | 24 | 1.33 |
| Ex. 21 | 16 | 21 | 1.31 |

Compared to Comparative Example 1, Examples 1 to 6 had the lower exposure dose for forming the pattern having a line width of 50 nm, and thus it is understood that Examples 1 to 6 had high sensitivities in the formation of the pattern having a line width of 50 nm, which requires high dissolution of the resist.

Compared to Comparative Example 2, Examples 7 to 18 had the lower exposure dose for forming the pattern having a line width of 50 nm, and thus it is understood that Examples 7 to 18 had high sensitivities in the formation of the pattern having a line width of 50 nm, which requires high dissolution of the resist.

Compared to Comparative Example 3, Example 19 had the lower exposure dose for forming the pattern having a line width of 50 nm, and thus it is understood that Example 19 had high sensitivities in the formation of the pattern having a line width of 50 nm, which requires high dissolution of the resist.

Compared to Comparative Example 4, Example 20 had the lower exposure dose for forming the pattern having a line width of 50 nm, and thus it is understood that Example 20 had high sensitivities in the formation of the pattern having a line width of 50 nm, which requires high dissolution of the resist.

Compared to Comparative Example 5, Example 21 had the lower exposure dose for forming the pattern having a line width of 50 nm, and thus it is understood that Example 21 had high sensitivities in the formation of the pattern having a line width of 50 nm, which requires high dissolution of the resist.

Compared to Comparative Example 1, Examples 1 to 6 had the smaller sensitivity ratio (no embedded wire/wire embedded substrate), and thus it is found that Examples 1 to 6 received the smaller influence from back scattering.

Compared to Comparative Example 2, Examples 7 to 18 had the smaller sensitivity ratio (no embedded wire/wire embedded substrate), and thus it is found that Examples 7 to 18 received the smaller influence from back scattering.

Compared to Comparative Example 3, Example 19 had the smaller sensitivity ratio (no embedded wire/wire embedded substrate), and thus it is found that Example 19 received the smaller influence from back scattering.

Compared to Comparative Example 4, Example 20 had the smaller sensitivity ratio (no embedded wire/wire embedded substrate), and thus it is found that Example 20 received the smaller influence from back scattering.

Compared to Comparative Example 5, Example 21 had the smaller sensitivity ratio (no embedded wire/wire embedded substrate), and thus it is found that Example 21 received the smaller influence from back scattering.

Note that, in Example 10, the resist film was not uniformly formed, as the base coating film was partially dissolved during the formation of the resist film.

According to Examples 10 to 13, it was found that the baking temperature of the resist sensitization film was preferably 50° C. to 300° C., more preferably 70° C. to 270° C.

Moreover, in Comparative Example 1 and Examples 1 to 13, the position of the pattern was sifted by 20 nm to 100 nm from the water standard position, but in Comparative Examples 3 to 4 and Examples 19 to 20, the sift of the position was by 5 nm or less. This is probably because in the latter case the conductive resin (B-3) was used as the resin for the resist sensitization film.

Note that, the wafer standard position means a cross-shaped stepwise pattern formed on the substrate in advance by patterning of the resist using an ArF excimer laser exposure device, and dry etching. Moreover, the deviation of the position from the wafer standard position was measured by means of an overlay measuring device manufactured by KLA-Tencor Japan, and the average value of the measured values was determined as the deviation value of the position.

Moreover, the coating films (the resist sensitization films) of Comparative Example 1 and Examples 1 to 6 can be removed by using a mixed solution of anisole and xylene (e.g. weight ratio of 70/30), other than the common dry etching.

Example 22

—Flash Memory and Production Thereof—

Example 22 is an example of the disclosed method for producing a semiconductor device using the disclosed material for forming a resist sensitization film. Note that, in Example 22, the resist films 26, 27, 29 and 32 below may be resist films to which the disclosed material for forming a resist sensitization film is applied. Specifically, any of the resists respectively used in Examples 1 to 21 can be used using, as a base thereof, the resist sensitization film formed of the disclosed material for forming a resist sensitization film. Note that, these resist sensitization films and resist films are formed in the same manner as in Examples 1 to 21.

The resist films 26, 27, 29, 32 and 43 may include the resist films 26a, 27a, 29a, 32a and 43a and the resist sensitization films 26b, 27b, 29b, 32b and 43b, respectively.

Figure 2:
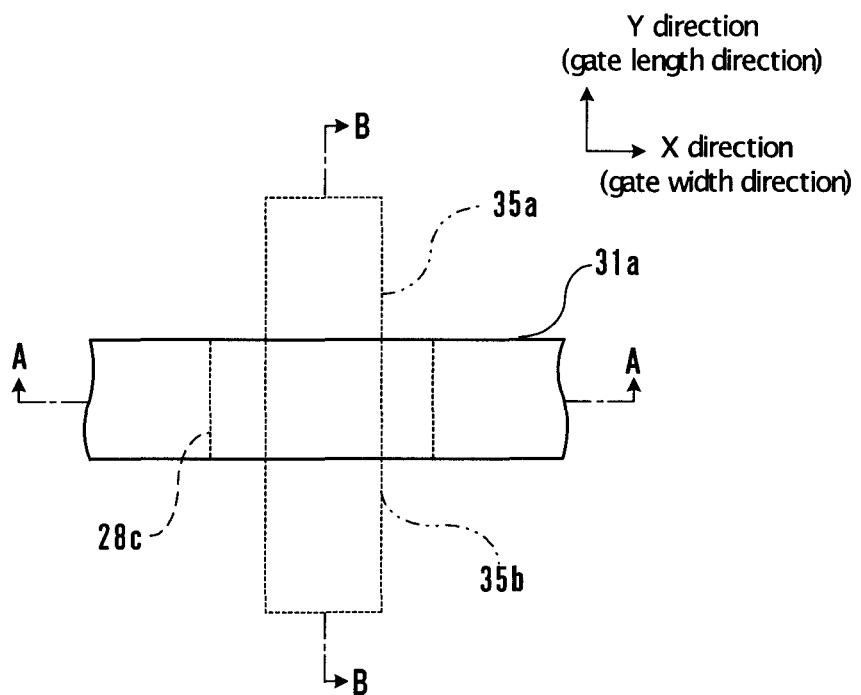
FIG. 2 a plan view illustrating a first example of FLASH EPROM produced by the disclosed method for producing a semiconductor device.

FIGS. 1 and 2 are top views (plan views) of FLASH EPROM, which is called a FLOTOX-type or ETOX-type. FIGS. 3A to 3I are schematic sectional views for explaining one example of the method for producing the FLASH EPROM. The left diagrams in FIGS. 3A to 3I illustrate a memory cell portion (a first element region), and are cross-sectional (in A direction) diagrams of the portion where a MOS transistor having a floating gate electrode is formed with respect to the gate width direction (the direction of X presented in FIGS. 1 and 2), the center diagrams illustrate the cell portion of the same are to the left diagrams, and are cross-sectional (in B direction) diagrams with respect to the gate length direction (the direction of Y presented in FIGS. 1 and 2) which is perpendicular to the X direction, and the right diagrams are cross-sectional (the direction of A in FIGS. 1 and 2) diagrams of the portion where the MOS transistor of the surrounding circuit area (a second element region).

At first, as illustrated in FIG. 3A, for example, a field oxide film 23 formed of an $SiO_2$ film is selectively formed in an element isolation region on a p-Si substrate (a semiconductor substrate) 22. Thereafter, for example, an $SiO_2$ film may be formed by thermal oxidation so that a thickness of a first gate insulation film 24a of the MOS transistor in the memory cell portion (the first element region) is to be, for example, 10 nm to 30 nm (100 Å to 300 Å). In the separate process, for example, an $SiO_2$ film may be formed by thermal oxidation so that a thickness of a second gate insulation film 24b of the MOS transistor in the surrounding circuit area (the second element region) is to be, for example, 10 nm to 50 nm (100 Å to 500 Å). In the case where the first gate insulation film 24a and the second gate insulation film 24b are formed to have the same thickness, oxide films may be formed as the first gate insulation film 24a and the second gate insulation film 24b at the same time in the same process.

Next, in order to form a MOS transistor having an n-depression channel in the memory cell portion (the left and center diagrams of FIG. 3A), the surrounding circuit area (the right diagram of FIG. 3A) may be masked with a resist film 26 for the purpose of controlling threshold voltage. Then, to the region, which will be a channel region below the floating gate electrode, phosphorus (P) or arsenic (As) may be introduced as a n-type impurity by ion implantation at the dose of $1\times10^{11}$ $cm^{-2}$, to $1\times10^{14}$ $cm^{-2}$, to form a first threshold controlling layer 25a. Here, the dose and conductive type of the impurity can be suitably selected between the depression type and the accumulation type.

Next, in order to form a MOS transistor having an n-depression channel in the surrounding circuit area (the right diagram of FIG. 3B), the memory cell portion (the left and center diagrams of FIG. 3B) may be masked with a resist film 27 for the purpose of controlling threshold voltage. Then, to the region, which will be a channel region below the gate electrode, phosphorus (P) or arsenic (As) may be introduced as a n-type impurity by ion implantation at the dose of $1\times10^{11}$ $cm^{-2}$ to $1\times10^{14}$ $cm^{-2}$, to form a second threshold controlling layer 25b.

Next, as the floating gate electrode of the MOS transistor of the memory cell portion (the left and center diagrams of FIG. 3C), and the gate electrode of the MOS transistor of the surrounding circuit area (the right diagram of FIG. 3C), a first polysilicon film (a first conductor film) 28 may be formed on the entire surface in the thickness of, for example, 50 nm to 200 nm (500 Å to 2,000 Å).

Figure 3C:
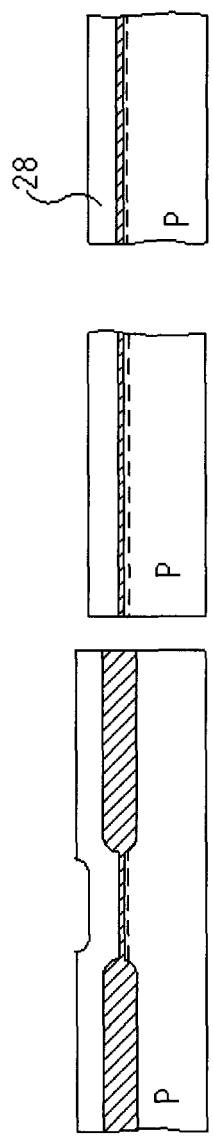
FIG. 3C is a schematic explanatory diagram illustrating the first example of FLASH EPROM produced by the disclosed
Figure 3D:
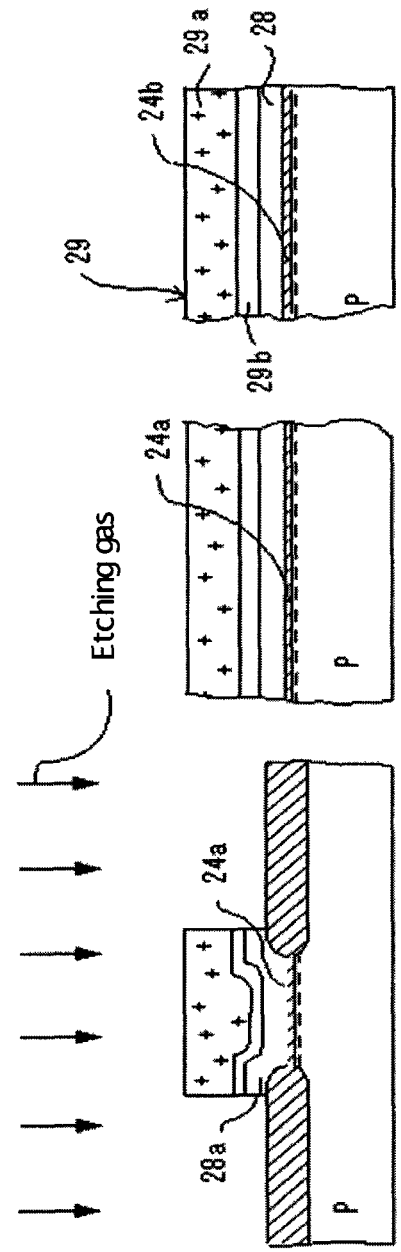
FIG. 3D is a schematic explanatory diagram illustrating the first example of FLASH EPROM produced by the disclosed method for producing a semiconductor device, and illustrating the sequential step of FIG. 3C.

Thereafter, as illustrated in FIG. 3D, the floating gate electrode 28a in the MOS transistor of the memory cell portion (the left and center diagrams of FIG. 3D) may be formed, for example, by patterning the first polysilicon film 28 using the resist film 29 formed as a mask. At this stage, the region, which will be a S/D region layer, may be left with resist film 29 covering the region, without patterning to regulate in the X direction and patterning to regulate in the Y direction to thereby give the final size as illustrated in FIG. 3D.

Figure 3E:
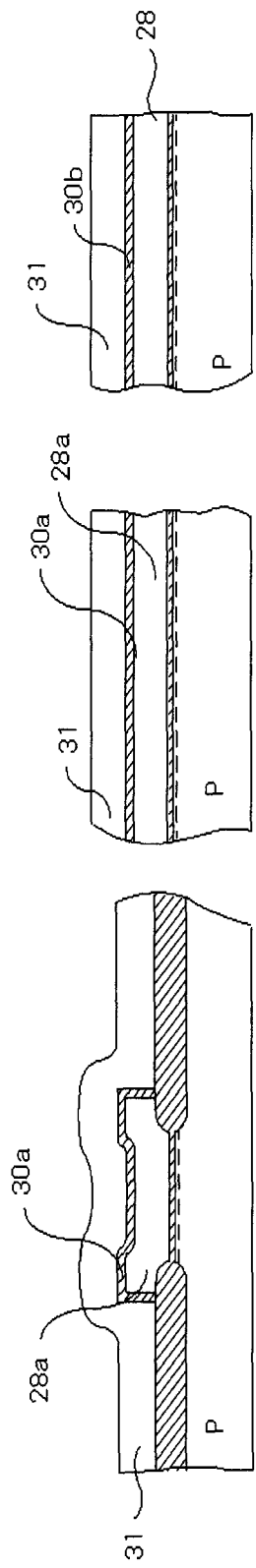
FIG. 3E is a schematic explanatory diagram illustrating the first example of FLASH EPROM produced by the disclosed method for producing a semiconductor device, and illustrating the sequential step of FIG. 3D.

Next, as illustrated in the left and center diagrams of FIG. 3E, after the resist film 29 is removed, a capacitor insulation film 30a formed of an $SiO_2$ film may be formed in the thickness of about 20 nm to about 50 nm (about 200 Å to about 500 Å) by thermal oxidation so as to cover the floating gate 28a.

Here, a capacitor insulation film 30b formed only of an $SiO_2$ film may also be formed on the first polysilicon film 28 of the surrounding circuit area (the right diagram of FIG. 3E). Note that, the capacitor insulation films 30a and 30b are each formed only of an $SiO_2$ film, but each of them can also be formed of a complex film in which two or three layers of an $SiO_2$ film and an $Si_3N_4$ film are laminated.

Next, as illustrated in FIG. 3E, a second polysilicon film (a second conductor film) 31, which will be a control gate electrode, may be formed in the thickness of, for example, 50 nm to 200 nm (500 Å to 2,000 Å) so as to cover the floating gate electrode 28a and the capacitor insulation film 30a.

Figure 3F:
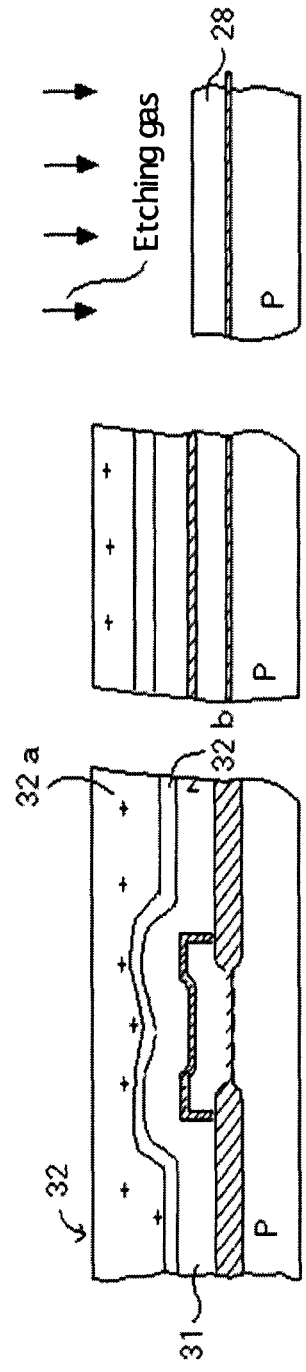
FIG. 3F is a schematic explanatory diagram illustrating the first example of FLASH EPROM produced by the disclosed method for producing a semiconductor device, and illustrating the sequential step of FIG. 3E.

Next, as illustrated in FIG. 3F, for example, the memory cell portion (the left and center diagrams of FIG. 3F) is masked with a resist film 32, the second polysilicon film 31 and the capacitor insulation film 30b in the surrounding circuit area (the right diagram of FIG. 3F) are sequentially removed by etching so as to expose the first polysilicon film 28.

Then, as illustrated in FIG. 3G, for example, the second polysilicon film 31, the capacitor insulation film 30a and the first polysilicon film 28a patterned only to regulate relative to the X direction in the memory cell portion (the left and center diagrams of FIG. 3G) may be patterned using the resist film 32 as a mask to regulate relative to the Y direction so as to give the final size of a first gate portion 33a. In this process, a laminate of the control gate electrode 31a, the capacitor insulation film 30c, and the floating gate electrode 28c each having a width of about 1 µm in the Y direction is formed, and in addition to this, the first polysilicon film 28 in the surrounding circuit area (the right diagram of FIG. 3G) may be patterned using the resist film 32 as a mask to give the final size of the second gate portion 33b, to thereby form a gate electrode 28b having a width of about 1 µm.

Next, using the laminated layer of the control gate electrode 31a, the capacitor insulation film 30c, and the floating gate electrode 28c of the memory cell portion (the left and center diagrams of FIG. 3H) as a mask, for example, phosphorus (P) or arsenic (As) may be introduced to an element forming region of the Si substrate 22 by ion implantation at the dose of $1\times10^{14}$ $cm^{-2}$ to $1\times10^{16}$ $cm^{-2}$. In this process, as well as forming n-type source-drain (S/D) region layers 35a and 35b, using the gate electrodes 28b of the surrounding circuit area (the right diagram of FIG. 3H) as a mask, phosphorus (P) or arsenic (As) may be introduced to the element forming region of the Si substrate 22, as a n-type impurity by ion implantation at the dose of $1\times10^{14}$ $cm^{-2}$ to $1\times10^{16}$ $cm^{-2}$, to form S/D region layers 36a and 36b.

Figure 3I:
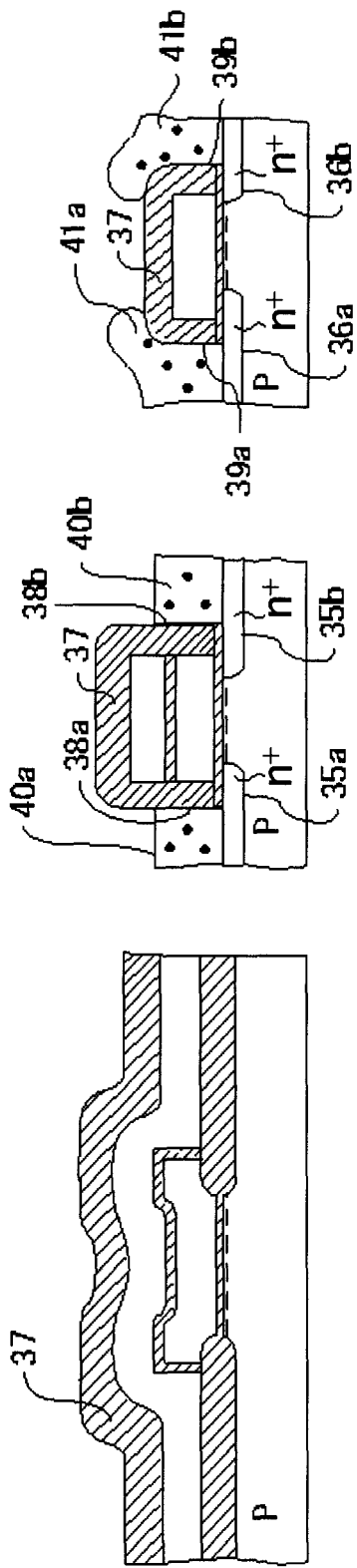
FIG. 3I is a schematic explanatory diagram illustrating the first example of FLASH EPROM produced by the disclosed method for producing a semiconductor device, and illustrating the sequential step of FIG. 3H.

Next, for example, an interlayer insulation film 37 formed of a PSG film may be formed in the thickness of about 500 nm (5,000 Å) to over the first gate portion 33a of the memory cell portion (the left and center diagrams of FIG. 3I) and the second gate portion 33b of the surrounding circuit portion (the right diagram of FIG. 3I).

Thereafter, for example, contact holes 38a and 38b, and contact holes 39a and 39b are formed in the interlayer insulation film 37, which has been formed on the S/D region layers 35a and 35b and S/D region layers 36a and 36b, and then, S/D electrodes 40a and 40b and S/D electrodes 41a and 41b may be respectively formed.

In the manner explained above, the FLASH EPROM as illustrated in FIG. 3I is produced as a semiconductor device.

In the FLASH EPROM, after forming the second gate insulation film 24b in the surrounding circuit area (the right diagrams of FIGS. 3A to 3I), the second gate insulation film 24b is covered with the first polysilicon film 28 or gate electrode 28b (the right diagrams of FIGS. 3A to 3I). Therefore, the second gate insulation film 24b maintains the same thickness as that of the film which is initially formed. As a result, it is easy to control the thickness of the second gate insulation film 24b, and is also easy to control the concentration of conductive impurities for controlling threshold voltage.

Note that, in Example 22, for forming the first gate portion 33a, the patterning may be performed at a certain width in the gate width direction (the direction of X in FIGS. 1 and 2), followed by patterning in the gate length direction (the direction of Y in FIGS. 1 and 2) to give a final width. However, the reverse order is also suitable, such that the patterning is performed at a certain width in the gate length direction (the direction of Y in FIGS. 1 and 2), followed by patterning in the gate width direction (the direction of X in FIGS. 1 and 2) to give a final width.

Figure 3J:
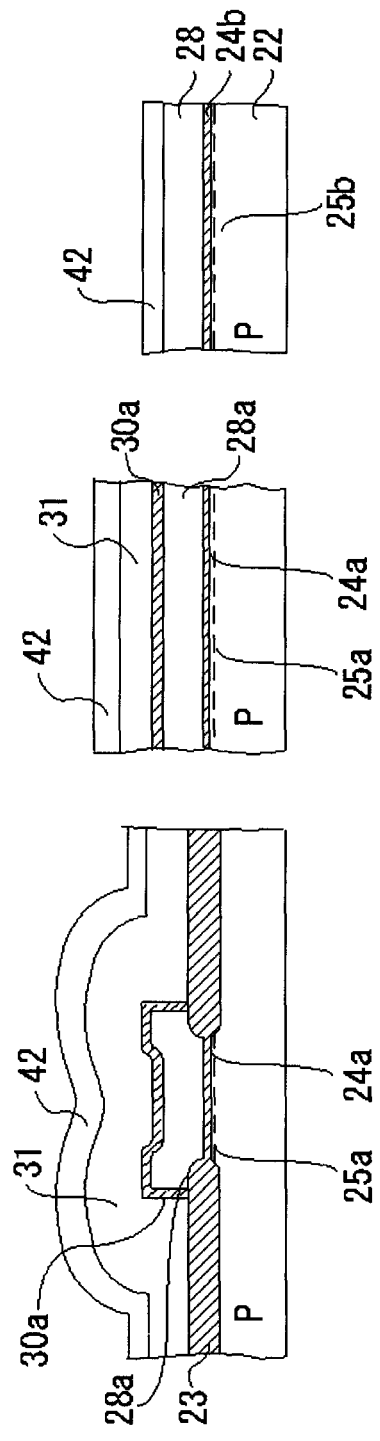
FIG. 3J is a schematic explanatory diagram illustrating a second example of FLASH EPROM produced by the disclosed method for producing a semiconductor device.
Figure 3K:
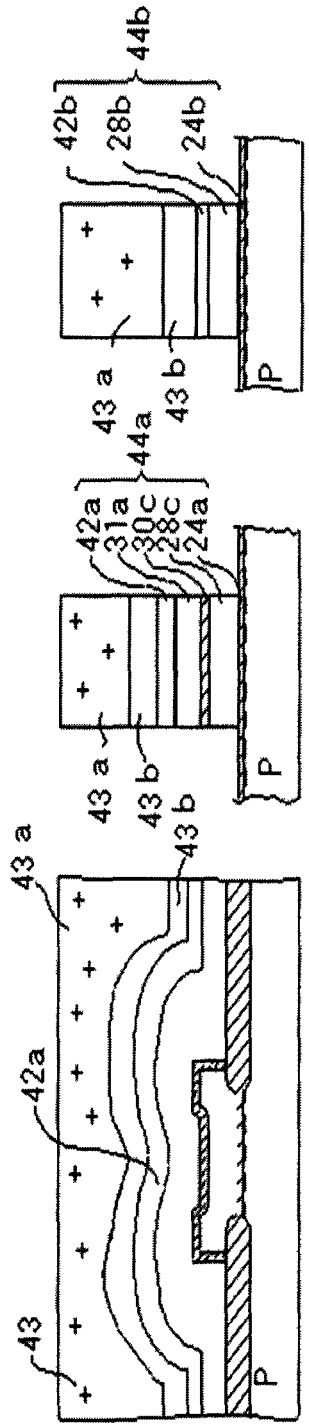
FIG. 3K is a schematic explanatory diagram illustrating the second example of FLASH EPROM produced by the disclosed method for producing a semiconductor device, and illustrating the sequential step of FIG. 3J.
Figure 3L:
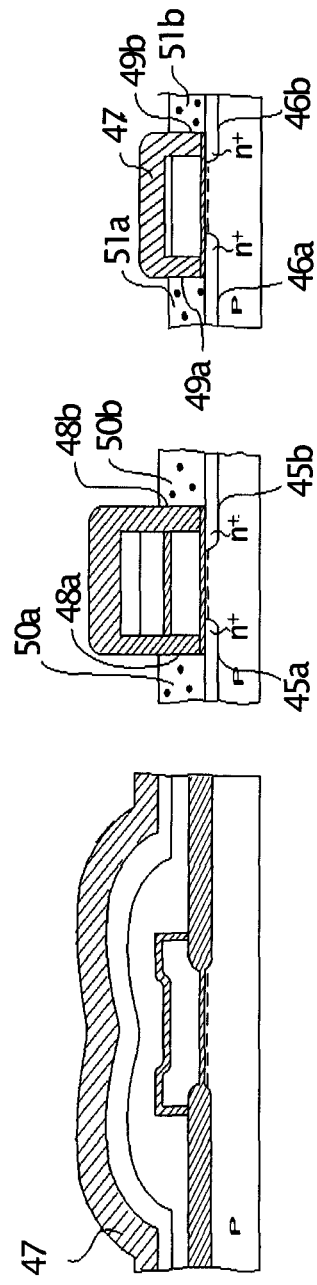
FIG. 3L is a schematic explanatory diagram illustrating the second example of FLASH EPROM produced by the disclosed method for producing a semiconductor device, and illustrating the sequential step of FIG. 3K.

The method for producing FLASH EPROM illustrated in FIGS. 3J to 3L is the same as in Example 22, provided that the processes after the process illustrated in FIG. 3E are changed to the processes as illustrated in FIGS. 3J to 3L. Namely, as illustrated in FIG. 3J, a high melting point metal film (a fourth conductor film) 42 formed of a tungsten (W) film or a titanium (Ti) film may be formed in the thickness of about 200 nm (2,000 Å) on the second polysilicon film 31 of the memory cell portion (the left and center diagrams of FIG. 3J) and the first polysilicon film 28 of the surrounding circuit area (the right diagram of FIG. 3J). This embodiment is different from Example 22 in that the polycide film is formed in this embodiment. After the process of FIG. 3J, the processes illustrated in FIGS. 3K to 3L may be performed in the same manners as in FIGS. 3G to 3I. Therefore, the explanations for FIGS. 3G to 3I are omitted from here, and references numbers in FIGS. 3J to 3L means the same as those in FIGS. 3G to 3I.

In the manner explained above, FLASH EPROM can be produced as a semiconductor device as illustrated in FIG. 3L.

Note that, in FIG. 3K, 43 denotes a resist film, 44a denotes a first gate portion, and 44b denotes a second gate portion. Moreover, in FIG. 3L, 45a, 45b, 46a, and 46b each denote a source-drain (S/D) region layer, 47 denotes an interlayer insulation film, 48a, 48b, 49a, and 49b each denote a contact hole, and 50a, 50b, 51a, and 51b each denote a source-drain (S/D) electrode.

In this FLASH EPROM, since the high melting point metal films (the fourth conductor films) 42a and 42b are respectively provided on the control gate electrode 31a and the gate electrode 28b, the electrical resistivity is further reduced.

Here, the high melting point layers (the fourth conductor film) 42a and 42b are used as a high melting point metal film (a fourth conductor film), but a high melting point metal silicide film such as a titanium silicide (TiSi) film may also be used.

Figure 3O:
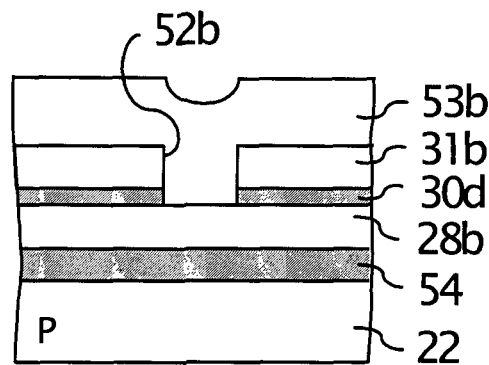
FIG. 3O is a schematic explanatory diagram illustrating a third example of FLASH EPROM produced by the disclosed method for producing a semiconductor device, and illustrating the sequential step of FIG. 3N.

The method for producing FLASH EPROM illustrated in FIGS. 3M to 3O is the same as in Example 22, provided that, for example, the second gate portion 33c of the surrounding circuit area (the second element region) (the right diagram of FIG. 3M) has the same structure as that of the first gate portion 33a of the memory cell portion (the first element region) (the left and center diagrams of FIG. 3M), namely the laminate of the first polysilicon film 28b (the first conductor film), the SiO₂ film 30d (the capacitor insulation film), and the second polysilicon film 31b (the second conductor film), and a gate electrode is formed by forming a short circuit between the first polysilicon film 28b and the second polysilicon film 31b, as illustrated in FIG. 3N or FIG. 3O.

Here, as illustrated in FIG. 3N, an opening 52a piercing through the first polysilicon film 28b (the first conductor film)/the SiO₂ film 30d (the capacitor insulation film)/the second polysilicon film 31b (the second conductor film) may be formed on the area other than the second gate portion 33c of FIG. 3M, for example on the insulation film 54. By filling the opening 52a with a third conductor film, such as a high melting point metal film 53a (e.g. a W film, or Ti film), a short circuit can be formed between the first polysilicon film 28b and the second polysilicon film 31b. Moreover, as illustrated in FIG. 3O, an opening 52b piercing through the SiO₂ film 30d (the capacitor insulation film)/the second polysilicon film 31b (the second conductor film) is formed so as to expose, at the bottom of the opening 52b, the first polysilicon film 28b, which is the underlayer of the SiO₂ film 30d. Thereafter, by filling the opening 52b with the third conductor film, such as a high melting point metal film 53b (e.g. a W film, or Ti film), the short circuit can be formed between the first polysilicon film 28b and the second polysilicon film 31b.

In this FLASH EPROM, since the second gate portion 33c of the surrounding circuit area has the same structure as that of the first gate portion 33a of the memory cell portion, the surrounding circuit area can be formed at the same time as the formation of the memory cell, to thereby make the production easy and efficient.

Note that, the third conductor film 53a or 53b is formed separately from the high melting point metal film (the fourth conductor film) 42, but they may be formed at the same time as the identical high melting point metal films.

Example 23

—Production of Magnetic Head—

Example 23 relates to a method for producing a magnetic head, as an applied example of a resist pattern of a resist film formed on a resist sensitization film serving as a base, using the disclosed material for forming a resist sensitization film. In Example 23, the following resist pattern R2A is a resist pattern to which the disclosed material for forming a resist sensitization film is applied. For example, the resist film may be formed using any of the resists used in Examples 1 to 21 on, as a base, the resist sensitization film formed using the disclosed material for forming a resist sensitization film. Note that, theses resist sensitization film and the resist film are formed in the same manner as in any of Examples 1 to 21, and then exposed to an electron beam to form the resist pattern.

The resist film R2 and the resist pattern R2A each include the resist film R2a and the resist sensitization film R2b.

The production process of a thin film magnetic head to which the disclosed material for forming a resist sensitization film and the disclosed method for producing a semiconductor device are applied will be explained with reference to FIGS. 4A to 4G.

Figure 4A:
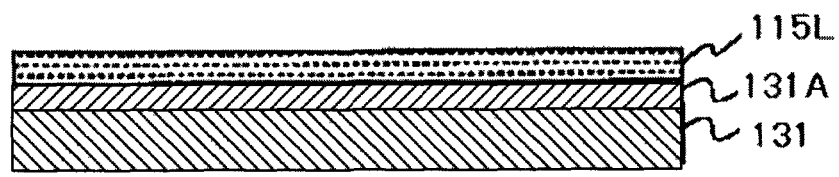
FIG. 4A is a schematic cross-sectional explanatory diagram illustrating an example where a resist pattern of a resist film formed on a resist sensitization film formed by using the disclosed material is applied for the production of a magnetic head.

With reference to FIG. 4A, a bottom magnetic shield layer 131 formed of NiFe alloy can be formed on an Al₂O₃—TiC substrate (not shown) through an Al₂O₃ film (not shown) by electroplating. A spin-bubble structure film 115L may be formed thereon by sputtering with a gap spacer layer of Al₂O₃ 131A provided between them.

Figure 4B:
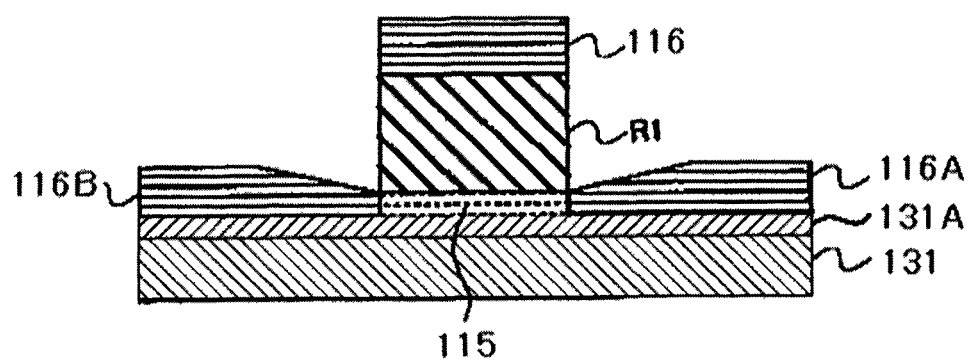
FIG. 4B a schematic cross-sectional explanatory diagram illustrating the example where a resist pattern of a resist film formed on a resist sensitization film formed by using the disclosed material is applied for the production of a magnetic head, and illustrating the sequential step of FIG. 4A.

In the process of FIG. 4B, for example, the spin-bubble structure film 115L may be patterned using the resist pattern R1 as a mask, so to give an intended shape having the width of about 300 nm, to thereby form a magnetic resistance effect element 115. In the process of FIG. 4B, moreover, a hard bias film 116 formed of CoCrPt is formed by sputtering using the resist pattern R1 as a mask to form hard bias patterns 116A and 116B on the both sides of the magnetic resistance effect element 115.

Figure 4C:
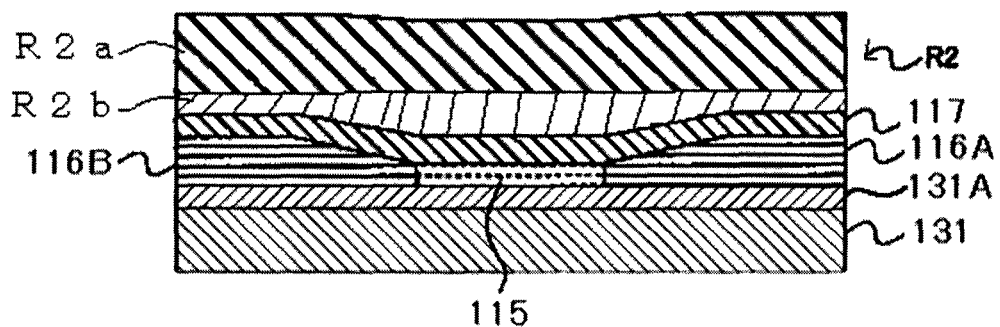
FIG. 4C a schematic cross-sectional explanatory diagram illustrating the example where a resist pattern of a resist film formed on a resist sensitization film formed by using the disclosed material is applied for the production of a magnetic head, and illustrating the sequential step of FIG. 4B.

Then, in the process of FIG. 4C, for example, the resist pattern R1 is removed, the CoCrPt film 116 deposited on the top of the resist pattern R1 is also removed, and then an organic polymer film 117 may be formed on the entire surface of the magnetic resistance effect element 115 so as to cover the hard bias patterns 116A and 116B present on the both sides of the magnetic resistance effect element 115.

In the process of FIG. 4C, for example, a resist film R2 may be provided on the organic polymer film 117 by applying the commercial KrF resist, for example UV-6, manufactured by Rohm and Haas Company in the thickness of, for example, 500 nm.

Figure 4D:
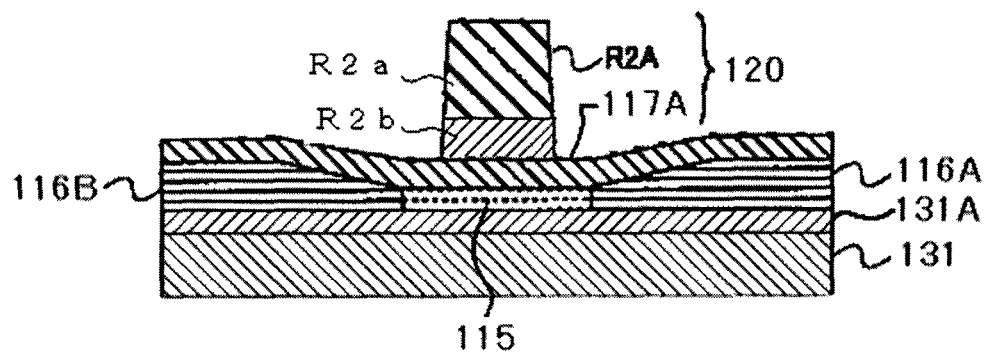
FIG. 4D a schematic cross-sectional explanatory diagram illustrating the example where a resist pattern of a resist film formed on a resist sensitization film formed by using the disclosed material is applied for the production of a magnetic head, and illustrating the sequential step of FIG. 4C.

In the process of FIG. 4D, for example, the magnetic resistance effect element portion is exposed to an electron beam, and other large areas are exposed to KrF laser beam using an electron beam device having an acceleration voltage of 50 keV and a KrF excimer laser of a wavelength of 248 nm as exposure light sources, followed by developing with a TMAH solution, so that the resist pattern R2A is formed so as to have a width of, for example, 150 nm. The organic polymer film 117 is also etched by this developing, to thereby form, below the resist pattern R2A, the organic polymer layer pattern 117A having the same width as that of the resist pattern R2A. As a result, a lift-off mask pattern 120 consisted of the resist pattern R2A and the organic polymer film pattern 117A is formed on the magnetic resist effect element 115.

Figure 4E:
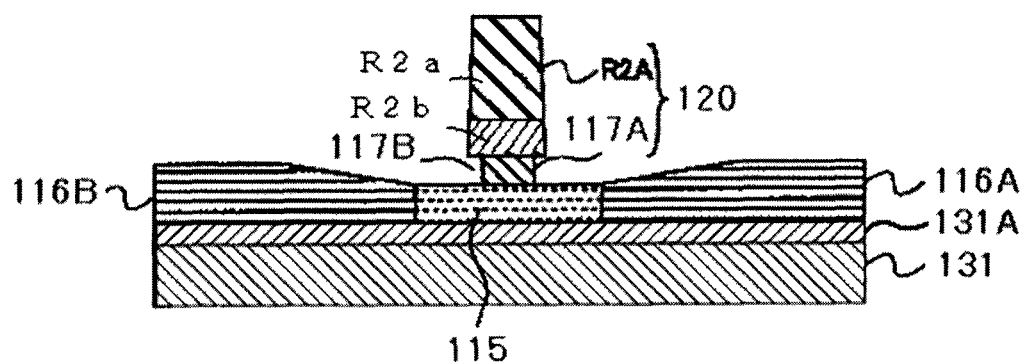
FIG. 4E a schematic cross-sectional explanatory diagram illustrating the example where a resist pattern of a resist film formed on a resist sensitization film formed by using the disclosed material is applied for the production of a magnetic head, and illustrating the sequential step of FIG. 4D.

Next, in the process of FIG. 4E, for example, a lift-off mask pattern 120 consisted of the resist pattern R2A and the organic polymer film 117A may be formed on the magnetic resistance effect element 115 by sliming treatment.

In the course of the sliming treatment of FIG. 4E, for example, a etching rate ratio between the resist pattern R2A formed of the resist film and the organic polymer film pattern 117A may be 1:1.2. After the sliming treatment, an undercut 117B is formed.

In the case where the resist pattern R2A has a width of about 100 nm, and the organic polymer film pattern 117A has a width of about 90 nm, about 5 nm of undercut 117B can be formed on both sides of the pattern 117A.

Figure 4F:
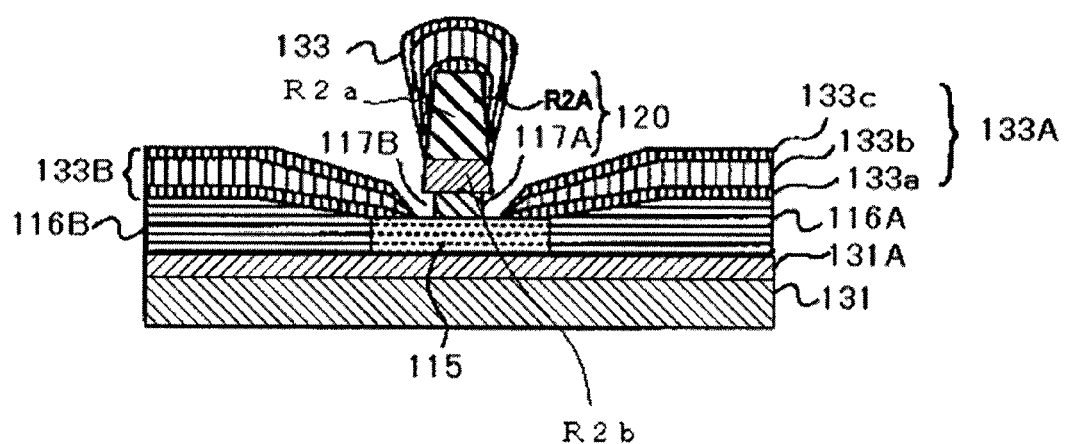
FIG. 4F a schematic cross-sectional explanatory diagram illustrating the example where a resist pattern of a resist film formed on a resist sensitization film formed by using the disclosed material is applied for the production of a magnetic head, and illustrating the sequential step of FIG. 4E.

In the process of FIG. 4F, moreover, a Ta film 133a, an Au film 133b, and a Ta film 133c are sequentially deposited in the thickness of 2 nm, 20 nm, and 2 nm, respectively, by for example sputtering using the lift-off mask pattern 120 of the organic polymer film pattern 117A and the resist pattern R2A as a mask to thereby deposit a readout electrode 133 having the laminate structure of Ta/Au/Ta. As a result, readout electrode patterns 133A and 133B each having the Ta/Au/Ta laminate structure can be formed on the hard bias patterns 116A and 116B, and both sides of the lift-off pattern 120.

Figure 4G:
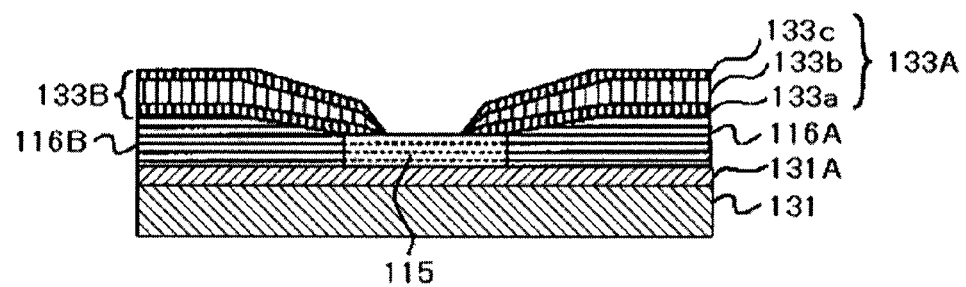
FIG. 4G a schematic cross-sectional explanatory diagram illustrating the example where a resist pattern of a resist film formed on a resist sensitization film formed by using the disclosed material is applied for the production of a magnetic head, and illustrating the sequential step of FIG. 4F.

In the process of FIG. 4G, the resist pattern R2A may be by using, for example, acetone to remove the electrode layer 133 deposited on the resist pattern R2A at the same time. Moreover, the organic polymer film pattern 117A may be removed by using N-methylpyrrolidone (NMP).

In the following step to the above, for example, a NiFe alloy layer 134 (see FIG. 5) constituting the upper magnetic shield layer and the bottom magnetic pole layer may be formed by electroplating via a gap spacer layer formed of $Al_2O_3$, and then a writing gap layer formed of $Al_2O_3$ may be further formed.

Figure 5:
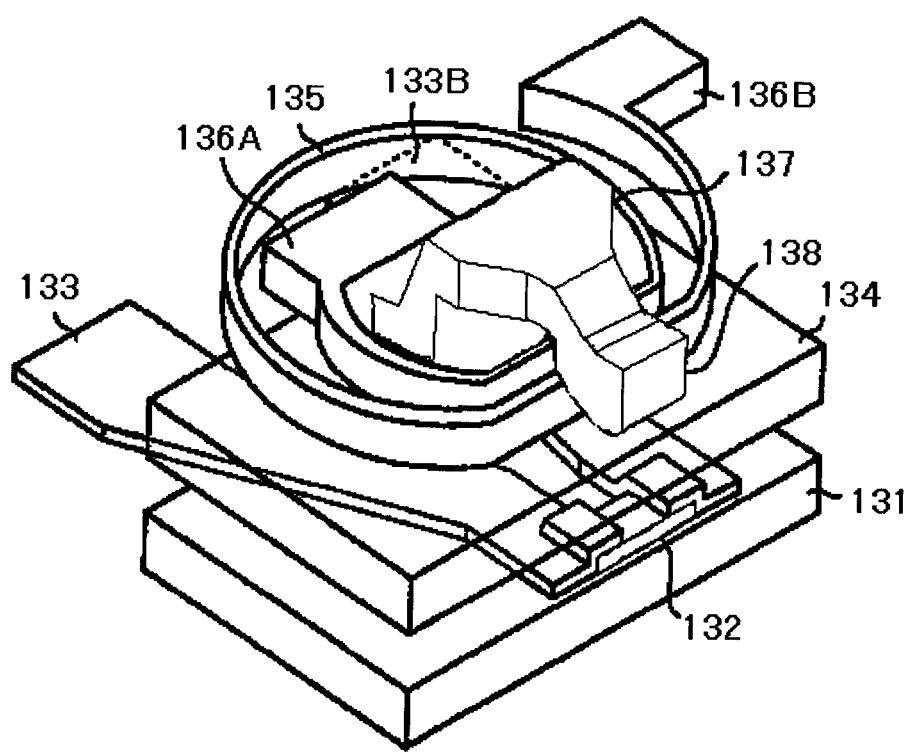
FIG. 5 is a perspective view illustrating an example of a magnetic head produced through the steps of FIG. 4A to FIG. 4G.

In the process of FIG. 5, for example, a first interlayer insulation film formed of the resist film may be formed, and then a writing coil 135, which is, for example a Cu layer in the shape of the horizontal spiral pattern, may be formed on the first interlayer insulation film. Moreover, at the both sides of the writing coil 135, wiring electrodes 136A and 136B may be provided, and a resist film may be formed so as to cover the writing coil to thereby form a second interlayer insulation film.

On the entire surface of the second interlayer insulation film, furthermore, a plating base layer formed of a Tim film may be provided, and using a resist mask formed thereon as a plating flame, a NiFe film may be selectively deposited on the second interlayer insulation film by electroplating to thereby form an upper magnetic pole layer 137 and a edge writing magnetic pole 138.

Next, after removing the resist mask, the exposed portion of the plating base layer may be removing by ion milling using Ar ions. Then, after forming an $Al_2O_3$ protective film on the entire surface, the substrate is cut to provide a magnetic head slider in which a readout head including the magnetic resistance effect element 115, and an induction-type thin film magnetic head for writing are integrated.

Note that, in FIG. 5, 132 denotes a magnetic resistance effect element.

As has been explained above, the disclosed method can produce the magnetic resistance sensor having a fine core width as a result of the use of the resist film, with easy processes, high accuracy, and high yield.

The disclosed material for forming a resist sensitization film contains a metal salt, a resin, and a solvent, which widens the selection of materials for use, is suitably applied for various patterning methods, production methods of semiconductor devices, and the like, and is particularly suitably used for the disclosed method for the aforementioned semiconductor device and magnetic head.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for producing a semiconductor device, comprising:
   applying a material for forming a resist sensitization film onto a processing surface so as to form a resist sensitization film;
   applying a resist onto the resist sensitization film so as to form a resist film;
   exposing the resist film to exposure light, and developing the exposed resist film so as to form a resist pattern; and
   etching the processing surface using the resist pattern as a mask so as to pattern the processing surface,
   wherein the material for forming a resist sensitization film comprises:
   a metal salt;
   a resin; and
   a solvent,
   wherein the metal salt is at least one selected from the group consisting of a potassium salt, a rubidium salt, a strontium salt, and a cesium salt,
   wherein the metal salt is contained in an amount of 1% by mass to 50% by mass relative to the amount of the resin, and
   wherein the resin is at least one selected from the group consisting of polymethylmethacrylate, poly-p-hydroxystyrene, polyvinyl alcohol, and 3-amino-4-methoxybenzene sulfonic acid polymer.

2. The method according to claim 1, further comprising heating the material for forming a resist sensitization film.

3. The method according to claim 2, wherein the heating is performed at the temperature of 50° C. to 300° C.

4. The method according to claim 1, further comprising removing the resist sensitization film.

5. The method according to claim 1, wherein the resist contains a resin and a solvent, and wherein the resin contained in the resist sensitization film is not compatible with the resin and the solvent contained in the resist.

* * * * *